(12) United States Patent
Tokuhara et al.

(10) Patent No.: US 11,451,726 B2
(45) Date of Patent: Sep. 20, 2022

(54) IMAGING DEVICE AND DRIVE METHOD THEREFOR

(71) Applicant: Panasonic Intellectual Property Management Co., Ltd., Osaka (JP)

(72) Inventors: Takeyoshi Tokuhara, Osaka (JP); Yoshiaki Satou, Kyoto (JP); Yusuke Okada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/364,441

(22) Filed: Jun. 30, 2021

(65) Prior Publication Data

US 2021/0329181 A1 Oct. 21, 2021

Related U.S. Application Data

(63) Continuation of application No. 17/005,240, filed on Aug. 27, 2020, now abandoned.

(30) Foreign Application Priority Data

Sep. 26, 2019 (JP) .............................. JP2019-176061

(51) Int. Cl.
*H04N 5/355* (2011.01)
*H04N 5/335* (2011.01)
(Continued)

(52) U.S. Cl.
CPC ....... *H04N 5/35563* (2013.01); *H04N 5/3355* (2013.01); *H04N 5/3698* (2013.01); *H01L 27/14612* (2013.01)

(58) Field of Classification Search
CPC ......... H01L 27/14609; H01L 27/14612; H01L 27/14636; H04N 5/3355; H04N 5/35563; H04N 5/3559; H04N 5/3698; H04N 5/374
See application file for complete search history.

(56) References Cited

U.S. PATENT DOCUMENTS 9,379,149 B2 * 6/2016 Yamashita .......... H01L 27/1464
10,658,406 B2 * 5/2020 Sato ................... H01L 27/14612
(Continued)

FOREIGN PATENT DOCUMENTS

JP 2007-104114 A 4/2007
JP 2017-098815 A 6/2017
(Continued)

OTHER PUBLICATIONS

Notice of Allowance issued in U.S. Appl. No. 17/005,240, dated Apr. 1, 2021.

*Primary Examiner* — Amy R Hsu
(74) *Attorney, Agent, or Firm* — McDermott Will & Emery LLP

(57) ABSTRACT

An imaging device includes: a photoelectric converter including a first electrode, a second electrode, and a photoelectric conversion layer that generates a signal charge; a charge accumulator connected to the first electrode to accumulate the signal charge; a first voltage supply circuit connected to the second electrode and that selectively supplies at least two different voltages including a first voltage and a third voltage greater than the first voltage; and a second voltage supply circuit that is connected to the charge accumulator via capacitance and that selectively supplies at least two different voltages including a second voltage and a fourth voltage less than the second voltage, where in a first period in which the first voltage supply circuit supplies the first voltage, the first period being included in an accumu- (Continued)

lation period for accumulating the signal charge in the charge accumulator, the second voltage supply circuit supplies the second voltage.

14 Claims, 21 Drawing Sheets

(51) Int. Cl.
*H04N 5/369* (2011.01)
*H01L 27/146* (2006.01)

(56) References Cited

U.S. PATENT DOCUMENTS

| | | | |
|---|---|---|---|
| 2007/0076108 A1 | 4/2007 | Misawa | |
| 2012/0086095 A1 | 4/2012 | Nishiyama et al. | |
| 2014/0139713 A1 | 5/2014 | Gomi et al. | |
| 2015/0130971 A1* | 5/2015 | Oike | H04N 5/357 348/241 |
| 2016/0014364 A1 | 1/2016 | Tashiro et al. | |
| 2016/0035920 A1 | 2/2016 | Tashiro et al. | |
| 2016/0119563 A1* | 4/2016 | Yamada | H01L 27/14612 348/312 |
| 2017/0180657 A1* | 6/2017 | Tashiro | H04N 5/369 |
| 2018/0020171 A1* | 1/2018 | Miyake | H01L 27/14669 |
| 2018/0249104 A1 | 8/2018 | Sasago et al. | |
| 2019/0238767 A1* | 8/2019 | Satou | H01L 27/14612 |

FOREIGN PATENT DOCUMENTS

| | | |
|---|---|---|
| JP | 2017-112513 A | 6/2017 |
| JP | 2017-216743 A | 12/2017 |
| JP | 2018-139375 A | 9/2018 |
| JP | 2019-054499 A | 4/2019 |
| WO | 2019/009023 A1 | 1/2019 |

\* cited by examiner

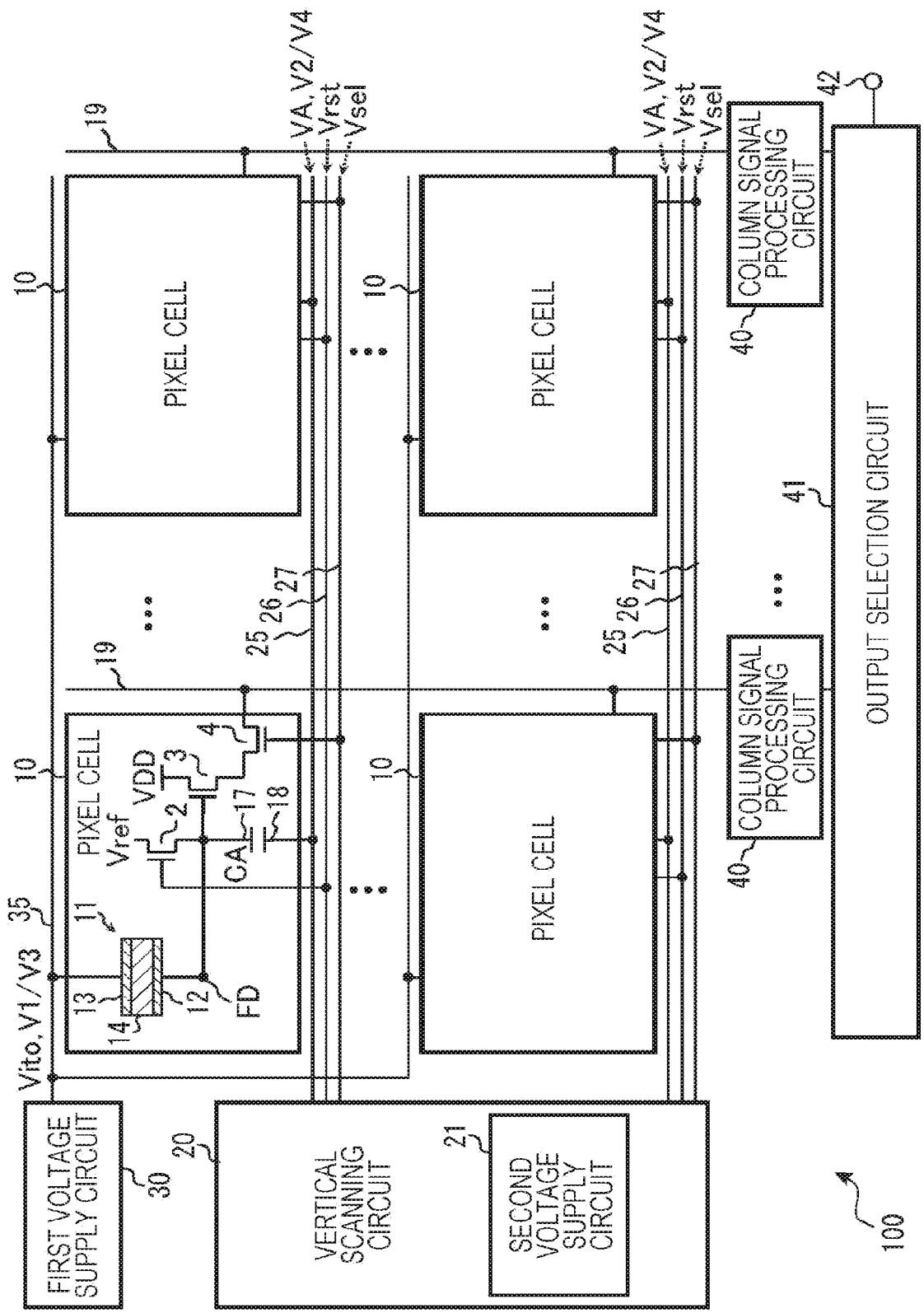

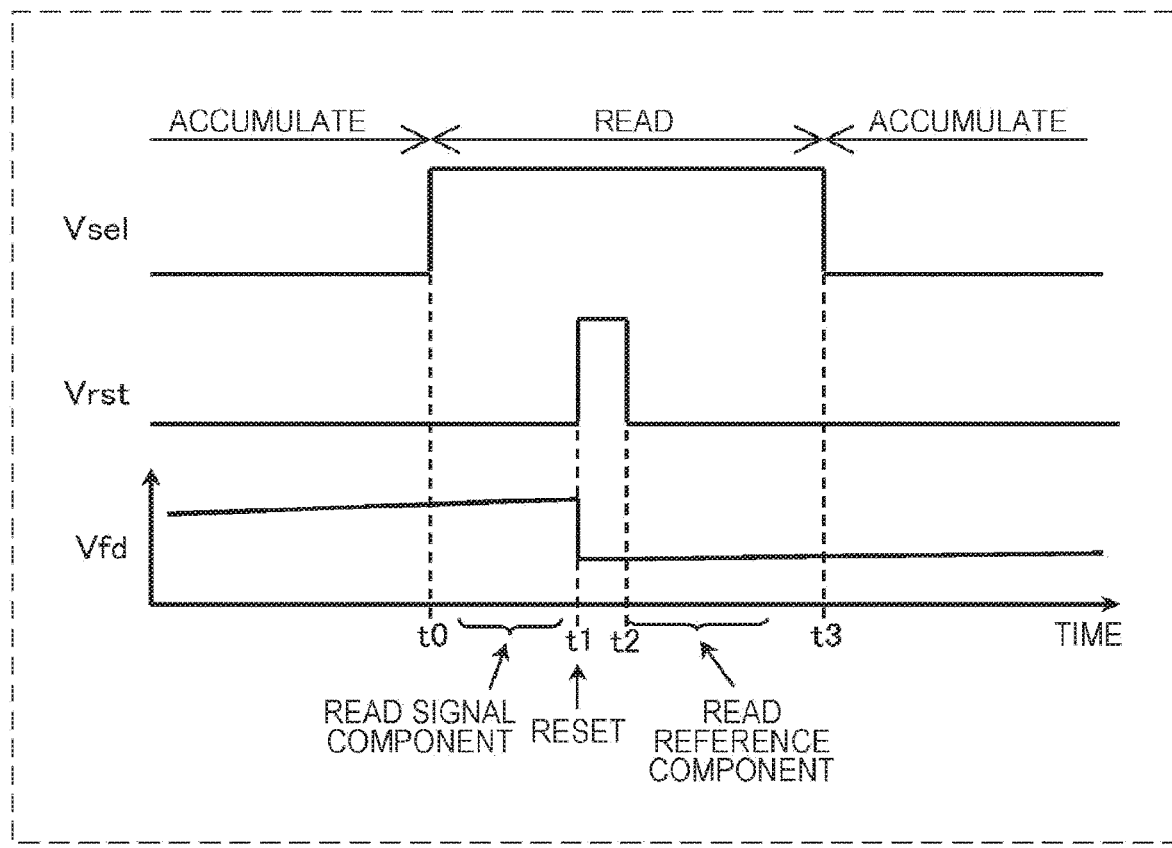

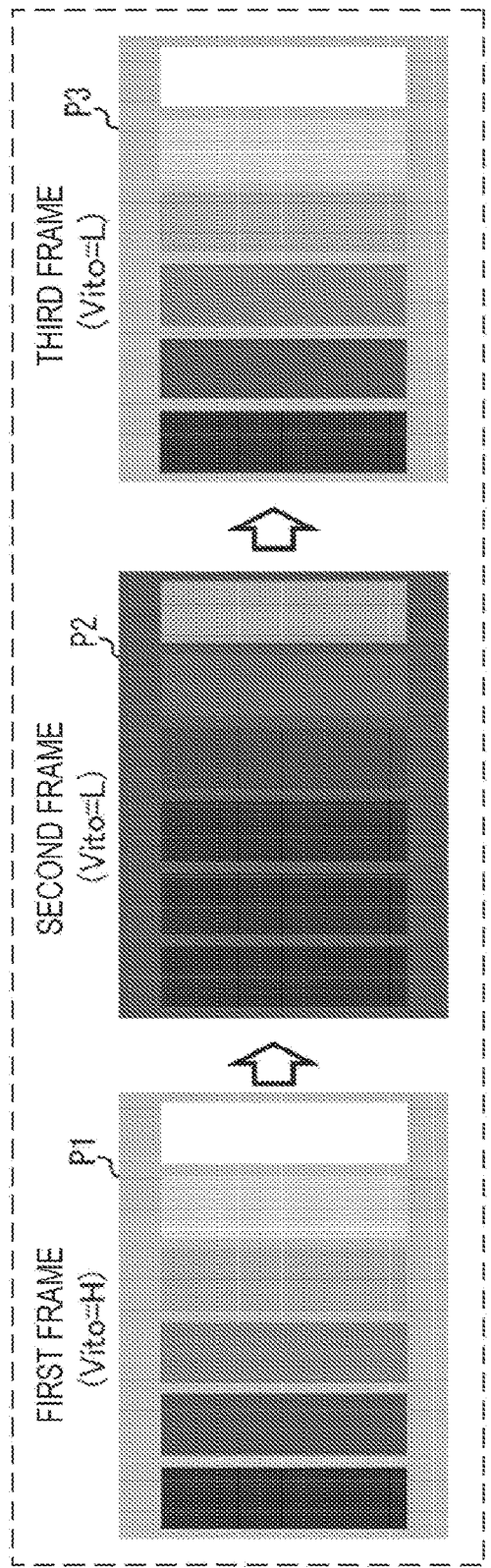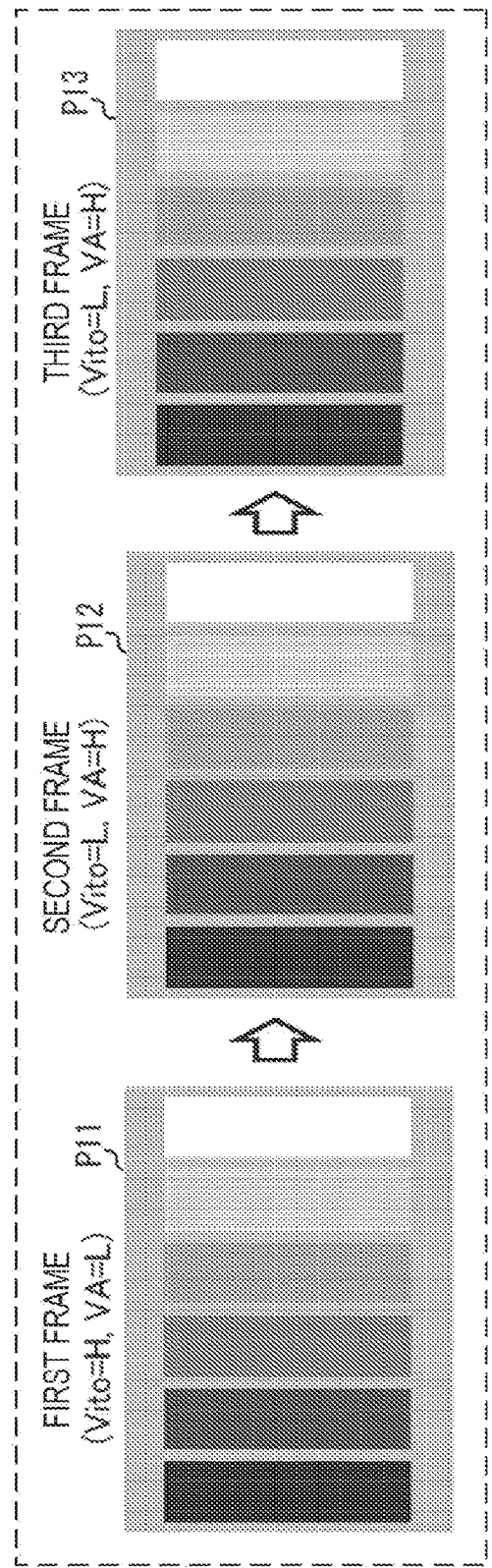

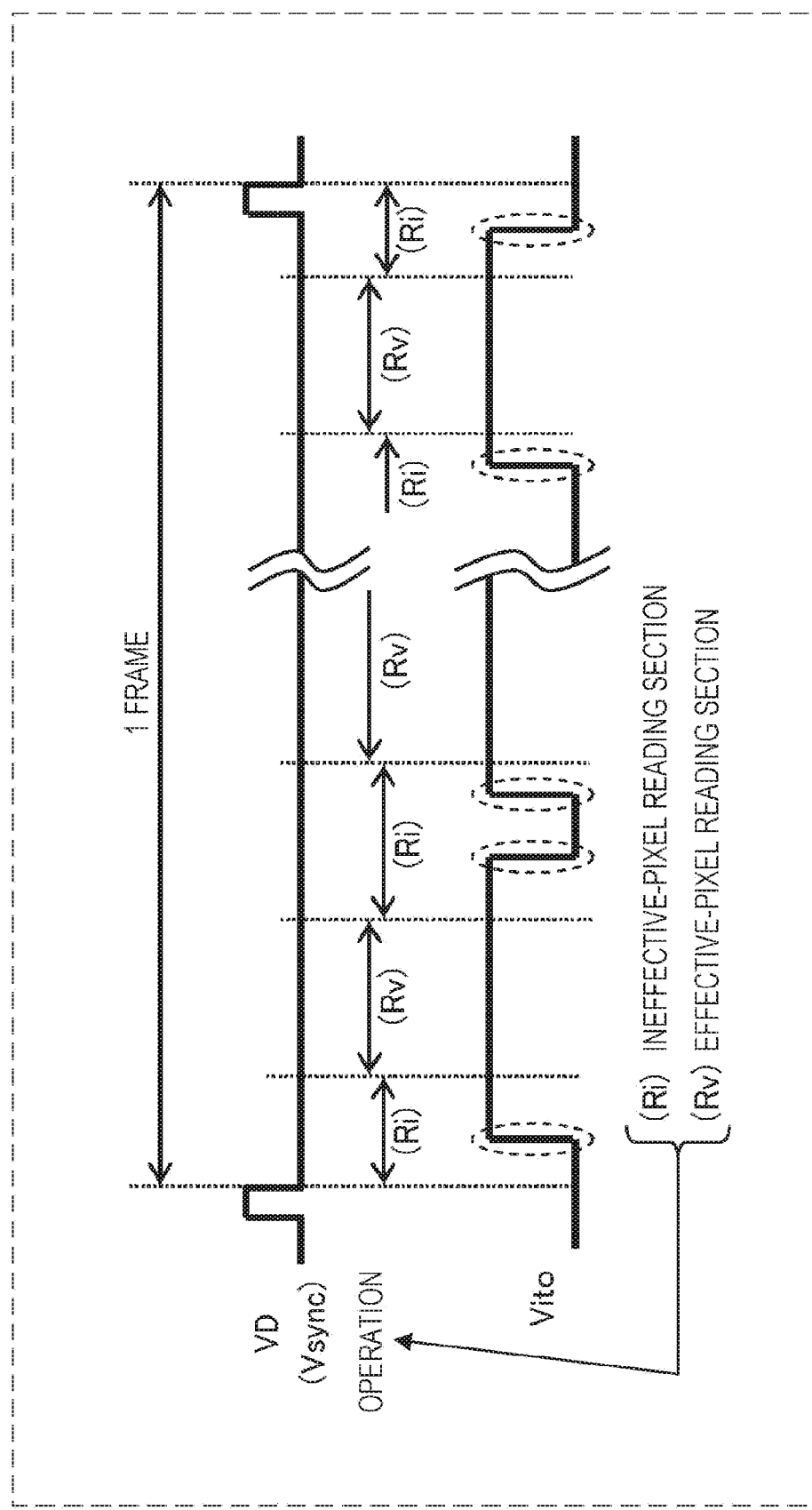

IMAGING DEVICE AND DRIVE METHOD THEREFOR

CROSS-REFERENCE TO RELATED APPLICATIONS

This application is a Continuation of U.S. application Ser. No. 17/005,240, filed on Aug. 27, 2020, which claims priority to Japanese Patent Application No. 2019-176061, filed on Sep. 26, 2019, the entire contents of each of which are incorporated herein by reference.

BACKGROUND

1. Technical Field

The present disclosure relates to an imaging device and a drive method therefor.

2. Description of the Related Art

Japanese Unexamined Patent Application Publication No. 2007-104114 discloses an imaging element in which a photosensitive layer, which is a photoelectric conversion layer, is stacked on a substrate. In the technology disclosed in Japanese Unexamined Patent Application Publication No. 2007-104114, the photosensitive layer is sandwiched between a pixel electrode layer and an opposing electrode layer. The pulse width of a pulsed voltage applied between the pixel electrode layer and the opposing electrode layer is adjusted to perform sensitivity control in the photosensitive layer.

Japanese Unexamined Patent Application Publication No. 2017-216743 discloses an imaging device that can realize a global shutter function. In the technology disclosed in Japanese Unexamined Patent Application Publication No. 2017-216743, the sensitivity is controlled using a voltage applied between a pixel electrode and an opposing electrode.

SUMMARY

In one general aspect, the techniques disclosed here feature an imaging device comprising: a photoelectric converter that includes a first electrode, a second electrode, and a photoelectric conversion layer between the first electrode and the second electrode and that generates a signal charge; a charge accumulator that is connected to the first electrode to accumulate the signal charge; a first voltage supply circuit that is connected to the second electrode and that selectively supplies at least two different voltages including a first voltage and a third voltage greater than the first voltage; and a second voltage supply circuit that is connected to the charge accumulator via capacitance and that selectively supplies at least two different voltages including a second voltage and a fourth voltage less than the second voltage, wherein in a first period in which the first voltage supply circuit supplies the first voltage, the first period being included in an accumulation period for accumulating the signal charge in the charge accumulator, the second voltage supply circuit supplies the second voltage.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1A is a block diagram illustrating a configuration example of an imaging device according to a first embodiment;

FIG. 5A is a time chart illustrating a reading operation example of the imaging device according to the first embodiment;

FIG. 9A is a view schematically illustrating images acquired by the imaging device according to the comparative example;

FIG. 9B is a view schematically illustrating images acquired by the imaging device according to the first embodiment;

FIG. 19 is a diagram illustrating an example of the timing of changing a voltage at an opposing electrode according to the fourth embodiment.

Figure 1B:
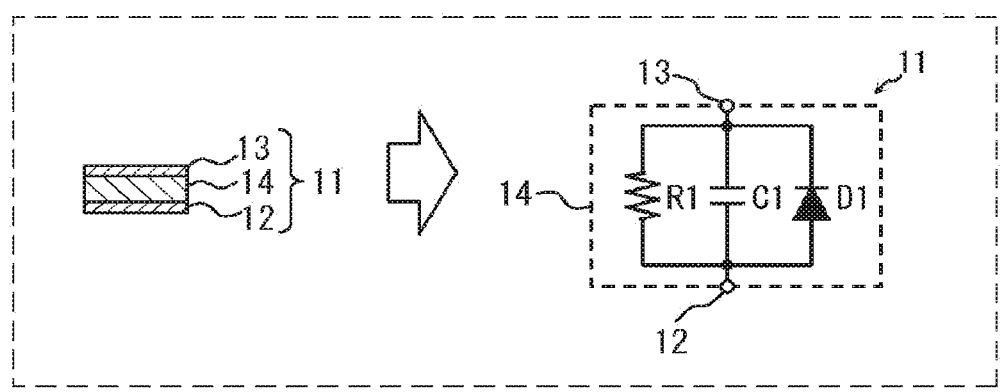
FIG. 1B is a diagram illustrating an equivalent circuit of a photoelectric converter in FIG. 1A.

DETAILED DESCRIPTION (Findings that LED to One Aspect of Present Disclosure)

As disclosed in Japanese Unexamined Patent Application Publication No. 2007-104114, the sensitivity can be controlled by applying a pulsed voltage between a pixel electrode and an opposing electrode and performing duty-ratio control thereof.

Specifically, for example, a pulsed voltage is applied to the opposing electrode to perform duty-ratio control. That is, a high voltage and a low voltage are alternately applied to the opposing electrode to change the ratio of the length of a period in which a high voltage is applied versus the length of a period in which a low voltage is applied. This makes it possible to change the sensitivity. In such sensitivity control, for example, when a period in which the high voltage is applied to the opposing electrode is increased to set the sensitivity to high sensitivity, performing reading and resetting in the period in which the high voltage is applied to the opposing electrode makes it easier to ensure the amount of time required for the reading and the resetting. Conversely, when the period in which the low voltage is applied to the opposing electrode is increased to set the sensitivity to low sensitivity, performing the reading and resetting in the period in which the low voltage is applied to the opposing electrode makes it easier to ensure the amount of time required for the reading and the resetting. That is, it is desirable that whether the reading and the resetting are performed when the potential at the opposing electrode is a high voltage or when the potential at the opposing electrode is a low voltage be selected for each frame in accordance with the duty ratio of the pulsed voltage.

The present inventors have found that a phenomenon in which the brightness of an acquired image changes significantly occurs in a frame immediately after changing whether the reading and the resetting are performed when the potential at the opposing electrode is a high voltage or when the potential at the opposing electrode is a low voltage.

According to study conducted by the inventors, owing to capacitive coupling between the opposing electrode and a pixel electrode, the potential at the pixel electrode changes upon a potential change at the opposing electrode, which causes the above-described phenomenon. A detailed description is given later.

Also, a potential change at the pixel electrode which occurs upon a potential change at the opposing electrode causes the intensity of an electric field, formed between the opposing electrode and the pixel electrode, to change in an exposure period. Thus, the potential change at the opposing electrode can also affect the maximum sensitivity and the amount of saturated charge.

Also, when an impurity region for accumulating signal charge is provided at a semiconductor substrate, a potential change at the pixel electrode which occurs upon a potential change at the opposing electrode causes a change in a potential difference between the impurity region and a region adjacent to the impurity region. Thus, the potential change at the opposing electrode can cause leakage of signal charge accumulated in the impurity region.

As described above, performing control for changing the potential at the opposing electrode can cause a problem that image-quality deterioration can occur.

Accordingly, the present disclosure provides an imaging device that reduces image-quality deterioration due to a potential change at an opposing electrode and a drive method for the imaging device.

An imaging device according to one aspect of the present disclosure includes: a photoelectric converter that includes a first electrode, a second electrode, and a photoelectric conversion layer between the first electrode and the second electrode and that generates signal charge through photoelectric conversion; a capacitor having a first terminal and a second terminal, the first terminal being connected to the first electrode; a first voltage supply circuit that selectively supplies at least two different voltages to the second electrode; and a second voltage supply circuit that selectively supplies at least two different voltages to the second terminal.

According to this aspect, it is possible to control a potential variation at the first electrode which occurs upon a potential change at the second electrode, which is an opposing electrode, and it is possible to reduce image-quality deterioration that is caused by a potential change at the opposing electrode.

In a predetermined period in each of a plurality of frames, the first voltage supply circuit supplies one of a plurality of voltages including a first voltage and a third voltage to the second electrode, the third voltage being higher than the first voltage. In the predetermined period, when the first voltage supply circuit supplies the first voltage to the second electrode, the second voltage supply circuit may supply a second voltage to the second terminal; and in the predetermined period, when the first voltage supply circuit supplies the third voltage to the second electrode, the second voltage supply circuit may supply a fourth voltage to the second terminal, the fourth voltage being lower than the second voltage.

According to this aspect, even when each of the first voltage supply circuit and the second voltage supply circuit supplies three voltage levels, it is possible to reduce potential variations at the first electrode which occur upon potential switching at the second electrode.

The plurality of voltages may further include a fifth voltage that is higher than the first voltage and that is lower than the third voltage; and in the predetermined period, when the first voltage supply circuit supplies the fifth voltage to the second electrode, the second voltage supply circuit may supply a sixth voltage to the second terminal, the sixth voltage being lower than the second voltage and being higher than the fourth voltage.

According to this aspect, since the voltage of the second voltage supply circuit has an opposite phase relationship with the voltage of the first voltage supply circuit, it is possible to cancel or reduce voltage variations at a charge accumulation node which are caused by a voltage at the opposing electrode. As a result, it is possible to reduce image-quality deterioration caused by a potential change at the opposing electrode.

The predetermined period may include a period for reading a signal corresponding to a potential at the first electrode.

According to this aspect, in a period for reading a pixel signal, it is possible to reduce potential variations at the first electrode which occur upon potential switching at the second electrode, which is an opposing electrode.

The predetermined period may include a period for resetting a potential at the first electrode.

According to this aspect, in a period for reading a pixel signal and reading a reference potential, it is possible to reduce potential variations at the first electrode which occur upon potential switching at the second electrode (i.e., an opposing electrode).

The imaging device may further include a first transistor having a gate connected to the first electrode, and the predetermined period may include a period in which the first transistor outputs a signal corresponding to a potential at the first electrode.

According to this aspect, in a period in which a first signal corresponding to signal charge is output from the first transistor, it is possible to reduce potential variations at the first electrode which occur upon potential switching at the second electrode.

The imaging device may further include a second transistor having a source or a drain connected to one of a source and a drain of the first transistor, and the predetermined period may include a period in which the second transistor turns on.

According to this aspect, in the period in which the second transistor turns on, it is possible to reduce potential variations at the first electrode which occur upon potential switching at the second electrode.

The imaging device may further include a charge accumulator that is connected to the first electrode to accumulate the signal charge, and in an accumulation period in which the signal charge is accumulated in the charge accumulator, the first voltage supply circuit may alternately supply the first voltage and the third voltage to the second electrode.

According to this aspect, the sensitivity of the photoelectric converter can be set according to the ratio of the first voltage versus the third voltage that are alternately generated.

The imaging device may further include a charge accumulator that is connected to the first electrode to accumulate the signal charge, and in a period in which the first voltage supply circuit supplies the third voltage to the second electrode, the period being included in an accumulation period for accumulating the signal charge in the charge accumulator, the second voltage supply circuit may supply the fourth voltage to the second terminal.

According to this aspect, in a mode in which reading is performed when the voltage at the opposing electrode is the first voltage, which has a low level, it is possible to suppress or reduce a sensitivity decrease and a saturation decrease.

The imaging device may further include a charge accumulator that is connected to the first electrode to accumulate the signal charge, and in a period in which the first voltage supply circuit supplies the first voltage to the second electrode, the period being included in an accumulation period for accumulating the signal charge in the charge accumulator, the second voltage supply circuit may supply the second voltage to the second terminal.

The signal charge may be a hole; and when the first voltage is supplied to the second electrode, the photoelectric converter does not necessarily have to have sensitivity to incident light. That is, the sensitivity of the photoelectric converter to incident light when the first voltage is supplied to the second electrode may be substantially zero.

The signal charge may be an electron; and when the third voltage is supplied to the second electrode, the photoelectric converter does not necessarily have to have sensitivity to incident light. That is, the sensitivity of the photoelectric converter to incident light when the third voltage is supplied to the second electrode may be substantially zero.

The imaging device may further include a plurality of pixels arranged in a matrix having a plurality of rows and a plurality of columns. Each of the pixels may include the photoelectric converter and the capacitor; and the second voltage supply circuit may selectively supply, for each row included in the plurality of rows, the at least two different voltages to the second terminal.

According to this aspect, the second voltage supply circuit can perform voltage supply for each row, thus making it possible to reduce image-quality deterioration caused by a potential change at the opposing electrode.

The plurality of pixels may include an effective pixel that outputs a signal corresponding to an amount of incident light and an ineffective pixel that outputs an optical black level; and in a period for reading a signal of the effective pixel in each of the frames, the first voltage supply circuit may supply one of the plurality of voltages including the first voltage and the third voltage to the second electrode. In the period for reading a signal of the effective pixel in each of the frames, the first voltage supply circuit does not necessarily have to change the voltage supplied to the second electrode.

According to this aspect, in an effective-pixel reading period, it is possible to suppress or reduce pixel signal variations that occur due to voltage variations at the opposing electrode (i.e., the second electrode). This makes it possible to suppress or reduce an image-quality decline.

A drive method according to another aspect of the present disclosure is a drive method for an imaging device that includes: a photoelectric converter that includes a first electrode, a second electrode, and a photoelectric conversion layer between the first electrode and the second electrode and that generates signal charge through photoelectric conversion; and a capacitor having a first terminal and a second terminal, the first terminal being connected to the first electrode. The drive method includes: supplying one of a plurality of voltages including a first voltage and a third voltage to the second electrode in a predetermined period in each of a plurality of frames, the third voltage being higher than the first voltage; supplying a second voltage to the second terminal when the first voltage is supplied to the second electrode in the predetermined period; and supplying a fourth voltage to the second terminal when the third voltage is supplied to the second electrode in the predetermined period, the fourth voltage being lower than the second voltage.

According to this aspect, in a mode in which reading is performed when the voltage at the opposing electrode is the third voltage, which has a high level, increasing the potential at the charge accumulation node in an accumulation period makes it possible to prevent the potential at the charge accumulation node in a reading period from becoming smaller than or equal to the reference potential. This makes it possible suppress or reduce an image-quality decline due to waveform deformation or deterioration of pixel signals.

Embodiments will be described below with reference to the accompanying drawings. The embodiments described below each represent a general or specific example. Numerical values, shapes, materials, constituent elements, the arrangement positions and connection forms of the constituent elements, steps, the order of the steps, and so on described in the embodiments are examples and are not intended to limit the present disclosure. Implementations of the present disclosure are not limited to the appended independent claims and may also be realized by another independent claim.

The accompanying drawings are schematic diagrams and are not necessarily strictly depicted. Also, in each figure, substantially the same elements are denoted by the same reference numerals, and a redundant description may be omitted or is briefly given herein. In the present disclosure, all or a part of circuits, units, devices, parts, or portions or all or a part of functional blocks in the block diagrams can be implemented by, for example, one or more electronic circuits including a semiconductor device, a semiconductor integrated circuit (IC), or a large-scale integration (LSI). The LSI or IC can be integrated into one chip or also may be a combination of a plurality of chips. For example, functional blocks other than a storage device may be integrated into one chip. Although the name used here is an LSI or IC, it may also be called a system LSI, a very large-scale integration (VLSI), or an ultra large-scale integration (ULSI) depending on the degree of integration. A field programmable gate array (FPGA) that can be programmed after manufacturing an LSI or a reconfigurable logic device that allows reconfiguration of the connection relationship inside the LSI or setup of circuit cells inside the LSI can also be used for the same purpose.

In addition, the functions or operations of all or a part of the circuits, units, devices, parts, or portions can be implemented by executing software. In such a case, the software is recorded on one or more non-transitory recording media, such as a read-only memory (ROM), an optical disk, or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

First Embodiment

[1.1 Circuit Configuration of Imaging Device]

FIG. 1A is a block diagram illustrating a configuration example of an imaging device according to a first embodiment.

An imaging device 100 illustrated in FIG. 1A includes a plurality of pixel cells 10, a vertical scanning circuit 20, a first voltage supply circuit 30, column signal processing circuits 40 for respective columns, and an output selection circuit 41. FIG. 1A also illustrates vertical signal lines 19 for the respective columns, second voltage supply lines 25 for respective rows, reset control signal lines 26 for the respective rows, selection control signal lines 27 for the respective rows, and a first voltage supply line 35 that is common to all the pixel cells 10.

The pixel cells 10 are arranged in a matrix to form a two-dimensional imaging region.

Each pixel cell 10 includes a photoelectric converter 11, a charge accumulation node FD, a capacitor CA, a reset transistor 2, an amplifying transistor 3, and an address transistor 4.

The photoelectric converter 11 includes a pixel electrode 12, an opposing electrode 13, and a photoelectric conversion layer 14 between the pixel electrode 12 and the opposing electrode 13. The pixel electrode 12 corresponds to the above-described first electrode. Also, the opposing electrode 13 corresponds to the above-described second electrode.

The photoelectric conversion layer 14 corresponds to portions that are included in a photoelectric conversion film, such as an organic layer, that covers the entire imaging region and that correspond to the pixel cells 10.

The pixel electrode 12 has an area corresponding to the occupation area of the corresponding pixel cell 10 in plan view of the imaging region and is an electrode for collecting signal charge generated in the photoelectric conversion layer 14.

The opposing electrode 13 corresponds to portions that are included in a transparent electrode that covers a surface of the photoelectric conversion layer on which incident light is incident and that correspond to the pixel cells 10. A voltage Vito is supplied to the opposing electrode 13 from the first voltage supply circuit 30 through the first voltage supply line 35. The voltage Vito is used in order to control the sensitivity of the photoelectric converters 11 and is common to all the pixel cells 10. At least two different voltages are selectively supplied as the voltage Vito. Hereinafter, a low level and a high level are assumed to be selectively set for the voltage Vito. Also, the low-level voltage of the voltage Vito is referred to as a "voltage V1", and the high-level voltage of the voltage Vito is referred to as a "voltage V3". The voltage V1 corresponds to the above-described first voltage. Also, the voltage V3 corresponds to the above-described third voltage.

The charge accumulation node FD functions as a charge accumulator in which signal charge collected by the pixel electrode 12 is accumulated. For example, the charge accumulation node FD may include a diffusion layer that is an impurity region provided at a semiconductor substrate or may include a capacitor. The charge accumulation node FD is also referred to as a "floating diffusion node (FD node)".

Each capacitor CA has a first terminal 17 and a second terminal 18. The first terminal 17 is connected to the pixel electrode 12. The capacitor CA has a function for cancelling or reducing voltage variations at the charge accumulation node FD which are caused by the voltage Vito. Thus, a voltage VA for cancelling or reducing the voltage variations is supplied from a second voltage supply circuit 21 to each second terminal 18. The voltage VA is used for cancelling or reducing the voltage variations at the charge accumulation node FD which are cause by the voltage Vito and selectively has two values, that is, a low level and a high level, with respect to the voltage Vito, which has two values. Hereinafter, the high-level voltage of the voltage VA may be referred to as a "voltage V2", and the low-level voltage of the voltage VA may be referred to as a "voltage V4". The voltage V2 corresponds to the above-described second voltage. Also, the voltage V4 corresponds to the above-described fourth voltage.

The reset transistor 2 is a switching transistor that resets the potential at the charge accumulation node FD to a reference potential in accordance with a reset control signal Vrst input to a gate connected to the reset control signal line 26.

The amplifying transistor 3 constitutes a source follower circuit that outputs a potential at a gate, connected to the charge accumulation node FD, via a source as a pixel signal. The amplifying transistor 3 corresponds to the above-described first transistor.

The address transistor 4 is a switching transistor that is turned on and off in accordance with a selection control signal Vsel (or an address signal) input to a gate connected to the selection control signal line 27. When the address transistor 4 is on, the pixel signal from the amplifying transistor 3 is output to the vertical signal line 19. The address transistor 4 corresponds to the above-described second transistor.

The vertical scanning circuit 20 scans the pixel cells 10 for each row to control reset and selection for each row. To this end, the vertical scanning circuit 20 is connected to the second voltage supply lines 25, the reset control signal lines 26, and the selection control signal lines 27 provided for the respective rows and outputs the voltage VA, the reset control signal Vrst, and the selection control signal Vsel to each row. The vertical scanning circuit 20 has the second voltage supply circuit 21.

Figure 2:
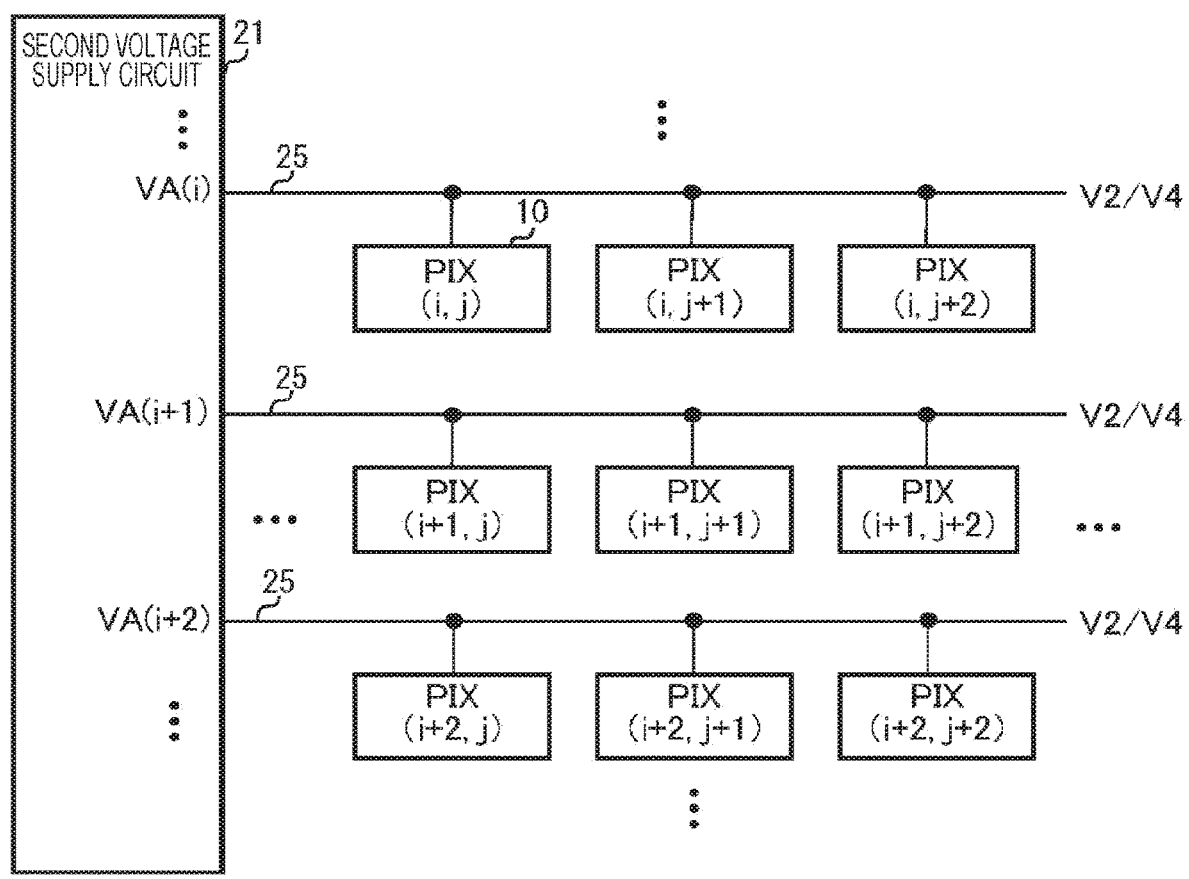
FIG. 2 is a block diagram illustrating a configuration example of a second voltage supply circuit and pixel cells according to the first embodiment.

The second voltage supply circuit 21 selectively supplies at least two different voltages to the second terminal 18 of each capacitor CA. FIG. 2 is a block diagram illustrating a configuration example of the second voltage supply circuit 21 and the pixel cells 10 according to the first embodiment. As illustrated in FIG. 2, the second voltage supply circuit 21 is connected to the second voltage supply lines 25 provided for the respective rows and selectively supplies the voltage V2, which has a high level, and the voltage V4, which has a w level, as the voltage VA for each row.

The first voltage supply circuit 30 selectively supplies the at least two different voltages Vito to the opposing electrode 13 through the first voltage supply line 35. Since the opposing electrode 13 corresponds to portions that are included in a transparent electrode that covers a surface of the photoelectric conversion layer and that correspond to the pixel cells 10, the voltage Vito supplied by the first voltage supply circuit 30 is common to all the pixel cells 10 and is a voltage for controlling the sensitivity of the photoelectric converters 11. Herein, the voltage Vito is assumed to be set to one of the voltages V1 and V3. In this case, the sensitivity is controlled according to the ratio of the time in which the voltage V1 is applied and the time in which the voltage V3 is applied, that is, a duty ratio. For example, when the voltage V1 corresponds to low sensitivity, for example, zero sensitivity, and the voltage V3 corresponds to high sensitivity, the sensitivity can be set continuously or step-by-step from the zero sensitivity to the high sensitivity according to the aforementioned duty ratio. Also, when the voltage V1 corresponds to zero sensitivity, the state in which the voltage V1 is applied corresponds to a state in which a shutter in the electronic shutter function is closed.

The column signal processing circuits 40 are provided for the respective columns. The column signal processing circuits 40 process signals output from the pixel cells 10 in the row, selected by the vertical scanning circuit 20, through the vertical signal lines 19. Pixel signals corresponding to the amounts of signal charges accumulated in the charge accumulation nodes FD in the pixel cells 10 and reference signals indicating reference potentials or reset levels are output from the pixel cells 10. The column signal processing circuits 40 perform correlated double sampling (CDS), analog-to-digital conversion, and so on.

The output selection circuit 41 selectively outputs signals, output from the column signal processing circuits 40 for the respective columns via an output terminal 42. [1.2 Device Structure of Pixel Cells 10]

Next, the configuration of the pixel cells 10 formed as a semiconductor device will be described with reference to a sectional view thereof.

Figure 3:
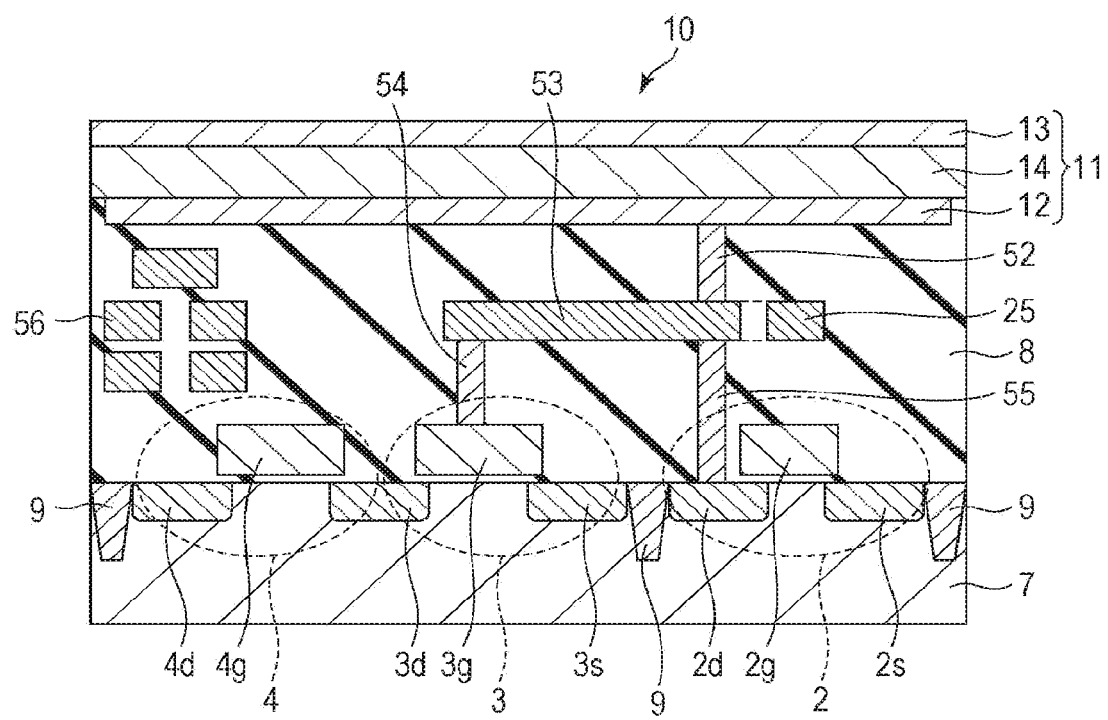
FIG. 3 is a schematic diagram illustrating one example of a section of one pixel cell according to the first embodiment.

FIG. 3 is a schematic diagram illustrating one example of a section of one pixel cell 10 according to the first embodiment. In the configuration illustrated in FIG. 3, the reset transistor 2, the amplifying transistor 3, and the address transistor 4, which are described above, are formed at a semiconductor substrate 7. The semiconductor substrate 7 is not limited to a substrate that is entirely made of semiconductor. The semiconductor substrate 7 may be, for example, an insulating substrate having a semiconductor layer provided on its surface at which a photosensitive region is formed. Herein, a description will be given of an example in which a p-type silicon substrate is used as the semiconductor substrate 7.

The semiconductor substrate 7 has impurity regions (in this case, n-type regions) 4d, 3s, 3d, 2d, and 2s and an element isolation region 9 for providing electrical isolation between the pixel cells 10. Herein, an element isolation region 9 is also provided between the impurity region 3s and the impurity region 2d. The element isolation regions 9 are formed, for example, by performing ion-implantation of acceptors under a predetermined implantation condition.

The impurity regions 4d, 3s, 3d, 2d, and 2s are typically diffusion layers formed in the semiconductor substrate 7. As schematically illustrated in FIG. 3, the amplifying transistor 3 incudes the impurity regions 3s and 3d and a gate electrode 3g. The gate electrode 3g is typically a polysilicon electrode. The impurity region 3s serves as, for example, a source region of the amplifying transistor 3. The impurity region 3d serves as, for example, a drain region of the amplifying transistor 3. A channel region of the amplifying transistor 3 is formed between the impurity regions 3s and 3d.

Similarly, the address transistor 4 includes the impurity regions 4d and 3d and a gate electrode 4g connected to the corresponding selection control signal line 27. In this example, the amplifying transistor 3 and the address transistor 4 share the impurity region 3d and are thus electrically connected to each other. The impurity region 4d serves as, for example, a drain region of the address transistor 4. The impurity region 4d is connected to the vertical signal line 19 illustrated in FIG. 1A.

The reset transistor 2 includes the impurity regions 2d and 2s and a gate electrode 2g connected to a reset control line 48. The impurity region 2s serves as, for example, a source region of the reset transistor 2. The gate electrode 2g is connected to the reset control signal line 26 illustrated in FIG. 1A.

An interlayer insulating layer 8 is disposed on the semiconductor substrate 7 so as to cover the amplifying transistor 3, the address transistor 4, and the reset transistor 2. As illustrated in FIG. 3, wiring layers 56 can be disposed in the interlayer insulating layer 8. The wiring layers 56 are typically formed of metal, such as copper, and may include, for example, wires, such as the vertical signal line 19 described above. The number of insulating layers included in the interlayer insulating layer 8 and the number of wiring layers 56 disposed in the interlayer insulating layer 8 can be arbitrary set and are not limited to the example illustrated in FIG. 3.

The photoelectric converter 11 described above is disposed on the interlayer insulating layer 8. In other words, in the embodiment of the present disclosure, the plurality of pixel cells 10, which constitute the imaging region, is formed on the semiconductor substrate 7. The plurality of pixel cells 10 that is two-dimensionally arrayed on the semiconductor substrate 7 forms a pixel region, which is a photosensitive region. The pixel pitch, which is the distance between two adjacent pixel cells 10, may be, for example, about 2 μm.

The photoelectric converter 11 includes the pixel electrode 12, the opposing electrode 13, and the photoelectric conversion layer 14 disposed therebetween. In this example, the opposing electrode 13 and the photoelectric conversion layer 14 are formed across the plurality of pixel cells 10. The pixel electrode 12 is provided in each pixel cell 10, is spatially isolated from the pixel electrodes 12 in other pixel cells 10 that are adjacent thereto, and is thus electrically isolated from the pixel electrodes 12 in the other pixel cells 10.

The opposing electrode 13 is typically a transparent electrode formed of transparent conductive material. The opposing electrode 13 is disposed on a light-incidence surface of the photoelectric conversion layer 14. Accordingly, light transmitted through the opposing electrode 13 is incident on the photoelectric conversion layer 14. Light detected by the imaging device 100 is not limited to light in a visible-light wavelength range (e.g., the range of 380 nm to 780 nm). The "transparency" as used herein means transmitting at least part of light in a wavelength range to be detected and does not necessarily have to transmit light in the entire visible-light wavelength range. Herein, electromagnetic waves including infrared and ultraviolet are generally referred to as "light", for the sake of convenience. For example, a transparent conducting oxide (TCO), such as indium tin oxide (ITO), indium zinc oxide (IZO), aluminum-doped zinc oxide (AZO), fluorine-doped tin oxide (FTO), stannic oxide ($SnO_2$), titanium dioxide ($TiO_2$), or zinc peroxide ($ZnO_2$), can be used for the opposing electrode 13.

In response to incident light, the photoelectric conversion layer 14 generates hole-electron pairs. The photoelectric conversion layer 14 is typically formed of semiconductor material including organic material. The photoelectric conversion layer 14 may be amorphous silicon or may be quantum dots made of inorganic material.

As described above with reference to FIG. 1A, the opposing electrode 13 is connected to the first voltage supply line 35 for sensitivity control, the first voltage supply line 35 being connected to the first voltage supply circuit 30. Also, in this case, the opposing electrode 13 is formed across the plurality of pixel cells 10. Accordingly, the voltage Vito from the first voltage supply circuit 30 can be applied to the plurality of pixel cells 10 through the first voltage supply line 35 at a time. When a sensitivity control voltage having a desired magnitude can be applied from the first voltage supply circuit 30, the opposing electrode 13 may be separately provided for each pixel cell 10. Similarly, the photoelectric conversion layer 14 may be separately provided for each pixel cell 10.

Controlling the potential at the opposing electrode 13 relative to the potential at the pixel electrode 12 allows the pixel electrode 12 to collect either holes or electrons of hole-electron pairs generated in the photoelectric conversion layer 14 through photoelectric conversion. For example, when the holes are used as signal charge, making the potential at the opposing electrode 13 higher than the potential at the pixel electrode 12 allows the pixel electrode 12 to selectively collect the holes. A case in which the holes are used as signal charge will be described below by way of example. Naturally, the electrons can also be used as signal charge.

When an appropriate bias voltage is applied between the opposing electrode 13 and the pixel electrode 12, which opposes the opposing electrode 13, the pixel electrode 12 collects one of positive and negative charges generated in the photoelectric conversion layer 14 through photoelectric conversion. The pixel electrode 12 is formed of metal, such as aluminum or copper, metal nitride, polysilicon given conductivity by doping impurities, or the like.

The pixel electrode 12 may be a light-blocking electrode. For example, forming a tantalum nitride (TaN) electrode having a thickness of 100 nm as the pixel electrode 12 can achieve a sufficient light-blocking effect. When the pixel electrode 12 is a light-blocking electrode, it is possible to suppress or reduce incidence of light transmitted through the photoelectric conversion layer 14 on the impurity regions that serve as the channel regions, the source regions, or the drain regions of the transistors formed at the semiconductor substrate 7. In the present embodiment, for example, incidence of light on the amplifying transistor 3, the address transistor 4, and the reset transistor 2 is suppressed or reduced. A light-blocking film may be formed in the interlayer insulating layer 8 by using the above-described wiring layer 56. Suppressing or reducing incidence of light on the channel regions of the transistors formed at the semiconductor substrate 7 can suppress or reduce, for example, variations in threshold voltages of the transistors. Also, suppressing or reducing incidence of light on the impurity regions formed in the semiconductor substrate 7 can suppress or reduce mixing of noise due to unintended photoelectric conversion in the impurity regions. Thus, the suppression or reduction of light incidence on the semiconductor substrate 7 contributes to improving the reliability of the imaging device 100.

As schematically illustrated in FIG. 3, the pixel electrode 12 is connected to the gate electrode 3g of the amplifying transistor 3 via a plug 52, a wire 53, and a contact plug 54. In other words, the gate of the amplifying transistor 3 has electrical connection with the pixel electrode 12. The plug 52 and the wire 53 are formed of, for example, metal, such as copper. The plug 52, the wire 53, and the contact plug 54 constitute part of the charge accumulation node FD. The wire 53 may be a portion of the wiring layers 56. The pixel electrode 12 is also connected to the impurity region 2d via the plug 52, the wire 53, and a contact plug 55. In the configuration illustrated in FIG. 3, the gate electrode 3g of the amplifying transistor 3, the plug 52, the wire 53, the contact plugs 54 and 55, and the impurity region 2d, which is one of the source region and the drain region of the reset transistor 2, serve as a charge accumulator in which signal charge collected by the pixel electrode 12 is accumulated.

A voltage corresponding to the amount of signal charge collected by the pixel electrode 12 and accumulated in the charge accumulator is applied to the gate of the amplifying transistor 3. The amplifying transistor 3 amplifies the applied voltage. The voltage amplified by the amplifying transistor 3 is selectively read via the address transistor 4 as a pixel signal.

The interlayer insulating layer 8 includes the second voltage supply line 25, which is connected to the second terminal 18 of the capacitor CA. Although FIG. 3 does not depict the capacitor CA, a specific configuration of the capacitor CA is not particularly limiting. The capacitor CA may have, for example, a metal-insulator-semiconductor (MIS) structure disposed in the interlayer insulating layer 8 or may be a depression-type MOS (DMOS) capacitor. Alternatively, the capacitor CA may have a metal-insulator-metal (MIM) structure. When the MIM structure is employed, a larger capacitance value can be easily obtained.

[1.3 Sensitivity Characteristic of Photoelectric Converter 11]

Next, a description will be given of a sensitivity characteristic of the photoelectric converter 11.

Figure 4:
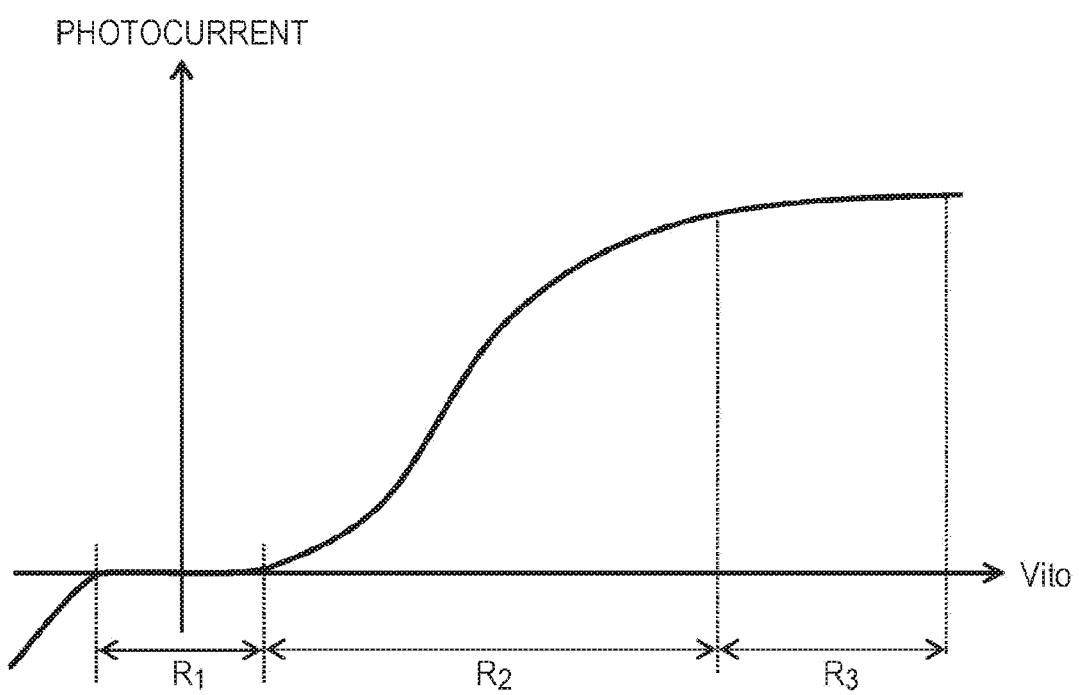
FIG. 4 is a block diagram illustrating one example of a photocurrent characteristic of the photoelectric converter according to the first embodiment.

FIG. 4 is a graph illustrating one example of a photocurrent characteristic of each photoelectric converter 11 according to the embodiment. In FIG. 4, the horizontal axis represents the voltage Vito applied to each photoelectric converter 11. In FIG. 4, the range of the voltage Vito is divided into voltage ranges $R_1$, $R_2$, and $R_3$, for the sake of convenience. The vertical axis represents the magnitude of photocurrent that is generated when a certain amount of light is incident for a certain period of time. In other words, the photocurrent on the vertical axis represents the sensitivity of the photoelectric converter 11.

When the voltage Vito is in the voltage range $R_1$, almost no photocurrent flows. That is, in the voltage range $R_1$, the sensitivity of the photoelectric converter 11 is substantially 0. When the voltage V1, which is the low-level voltage Vito, is set to a value in the voltage range $R_1$, the sensitivity is substantially 0, and this characteristic can thus be utilized for a shutter function. For example, when the voltage Vito is set to 0 V, it is possible to obtain a state that is the same as a state in which a physical shutter is closed.

When the voltage Vito is in the voltage range $R_2$, the amount of photocurrent increases as the voltage Vito increases. When the voltage Vito is made variable in the voltage range $R_2$, the sensitivity of the photoelectric converter 11 can be varied continuously or step-by-step. Also, the lower-limit voltage and the upper-limit voltage of the voltage range $R_2$ have a difference that is larger than or equal to 1 V.

When the voltage Vito is in the voltage range $R_3$, the photocurrent is substantially saturated. When the voltage V3, which is a high-level voltage Vito, is set to a value in the voltage range $R_3$, the sensitivity of the photoelectric converter 11 can be set to its highest sensitivity. During exposure with the voltage Vito in the voltage range $R_3$, even when a potential difference applied to the photoelectric converter 11 decreases as a result of an increase in the potential at the charge accumulation node FD owing to the signal charge, the sensitivity is less likely to decrease, making it possible to ensure linearity between illuminance and the amount of signal charge that is generated.

Also, other than changing the voltage Vito in an analog manner by utilizing the characteristics of the voltage range $R_2$, the voltage Vito can also be digitally changed in order to make the sensitivity of the photoelectric converter 11 variable. In this case, for example, pulse width modulation (PWM) can be used to digitally control the sensitivity of the photoelectric converter 11. That is, adjusting the ratio of the low-level period of the voltage Vito and the high-level period thereof in an exposure period makes it easy to control the sensitivity.

[1.4 Potential Variations at Charge Accumulation Node FD Owing to Variations in Voltage Vito]

Now, a description will be given of potential variations at the charge accumulation node FD owing to variations in the voltage Vito applied to the opposing electrode for sensitivity adjustment. In addition, the capacitor CA illustrated in FIG. 1A has a function for cancelling or reducing voltage variations at the charge accumulation node FD owing to the voltage Vito. This point will also be described in detail.

FIG. 1B is a diagram illustrating an equivalent circuit of the photoelectric converter 11 in FIG. 1A. As illustrated in FIG. 1B, the photoelectric converter 11 can be represented by a parallel circuit of a resistance component R1, a capacitance component C1, and a diode component D1. In this equivalent circuit, the photoelectric converter 11 can be regarded as the capacitance component C1 under a bias condition that the amount of dark current in the photoelectric conversion layer 14 is small, and forward current of the diode component D1 does not flow. In this case, a potential variation at the charge accumulation node FD owing to a variation in the voltage Vito is given by equation 1 below:

$$\Delta Vfd = (C1/(Cfd+CA+C1))\Delta Vito \quad \text{(Equation 1)}$$

In this case, $\Delta$Vito represents a potential variation in the voltage Vito, that is, a difference (V3−V1) between the voltages V3 and V1. $\Delta$Vfd represents potential variations at the charge accumulation node FD. C1 represents a capacitance component of the photoelectric converter 11, Cfd represents the capacitance value of parasitic capacitance at the charge accumulation node FD, and CA represents the capacitance value of the capacitor CA.

Meanwhile, a potential variation at the charge accumulation node FD owing to the voltage VA applied to the second terminal 18 of the capacitor CA connected to the charge accumulation node FD is given by equation 2 below:

$$\Delta Vfd = (CA/(Cfd+CA+C1))\Delta VA \quad \text{(Equation 2)}$$

In this case, $\Delta$VA represents the potential variation at the capacitor CA, that is, a difference (V2−V4) between the voltages V2 and V4.

Equations 1 and 2 cancel each other out when the sum of equations 1 and 2 is zero, that is, when the condition given by equation 3 below is satisfied.

$$CA \cdot \Delta VA = -C1 \cdot \Delta Vito \quad \text{(Equation 3)}$$

The first voltage supply circuit 30 and the second voltage supply circuit 21 set the voltages Vito and VA, respectively, so as to satisfy equation 3. However, equation 3 does not always have to be satisfied, and equation 3 may be satisfied in only a predetermined period. In this case, the predetermined period refers to a period in which the potential variation $\Delta$Vfd in equation 1 affects an image quality or pixel signals. The predetermined period includes, for example, a period in which pixel signals and so on are read from the pixel cells 10 through the vertical signal lines 19, a period in which the charge accumulation nodes FD are reset, and so on.

The voltage VA does not necessarily have to fully satisfy equation 3. For example, control may be performed so that the voltage VA is varied to the negative side when the voltage Vito varies to the positive side, and the voltage VA is varied to the positive side when the voltage Vito varies to the negative side. In this case, since the electrical characteristics can also be brought close to the state in equation 3, influences on the image quality or the pixel signals can be reduced.

[1.5 Operation Example]

Next, a description will be given of an operation of the imaging device according to the first embodiment.

FIG. 5A is a time chart illustrating a reading operation example of the imaging device according to the first embodiment. In FIG. 5A, the horizontal axis represents a time axis. Also, the reference control Vsel indicates a waveform of the selection control signal Vsel applied to the gate of the address transistor 4. The reset control signal Vrst indicates a waveform of the reset control signal Vrst applied to the gate of the reset transistor 2. The potential Vfd indicates a change in the voltage at the charge accumulation node FD. In FIG. 5A, each period denoted by "accumulate" is a period for accumulating signal charge, generated by photoelectric conversion, in the charge accumulation node FD. The period is also called an accumulation period or an exposure period. A period denoted by "read" is a period for reading a signal from the pixel cell 10 to the column signal processing circuit 40. This period is also called a reading period. The reading period includes a period for resetting the potential at the charge accumulation node FD. In the drawings used in the following description, the periods denoted by "accumulate" and "read" represent periods that are analogous to those described above.

At time t0, the selection control signal Vsel rises to thereby turn on the address transistor 4. A period from t0 to t3 in which the address transistor 4 is in the on state is the reading period.

In a period from t0 to t1, a pixel signal corresponding to the amount of signal charge accumulated in the charge accumulation node FD is read.

At time t1, the reset control signal rises to thereby turn on the reset transistor 2. Thus, the potential at the charge accumulation node FD is reset to a reference potential Vref. The reference potential Vref is, for example, 0 V.

At time t2, the reset control signal falls to thereby turn off the reset transistor 2. In a period from t2 to t3, a reference signal corresponding to the reference potential Vref is read. A difference between the pixel signal and the reference signal is a signal corresponding to the amount of illumination light.

Now, a cause for the above-described problem will be described in detail with reference to FIGS. 6 and 9A.

Figure 6:
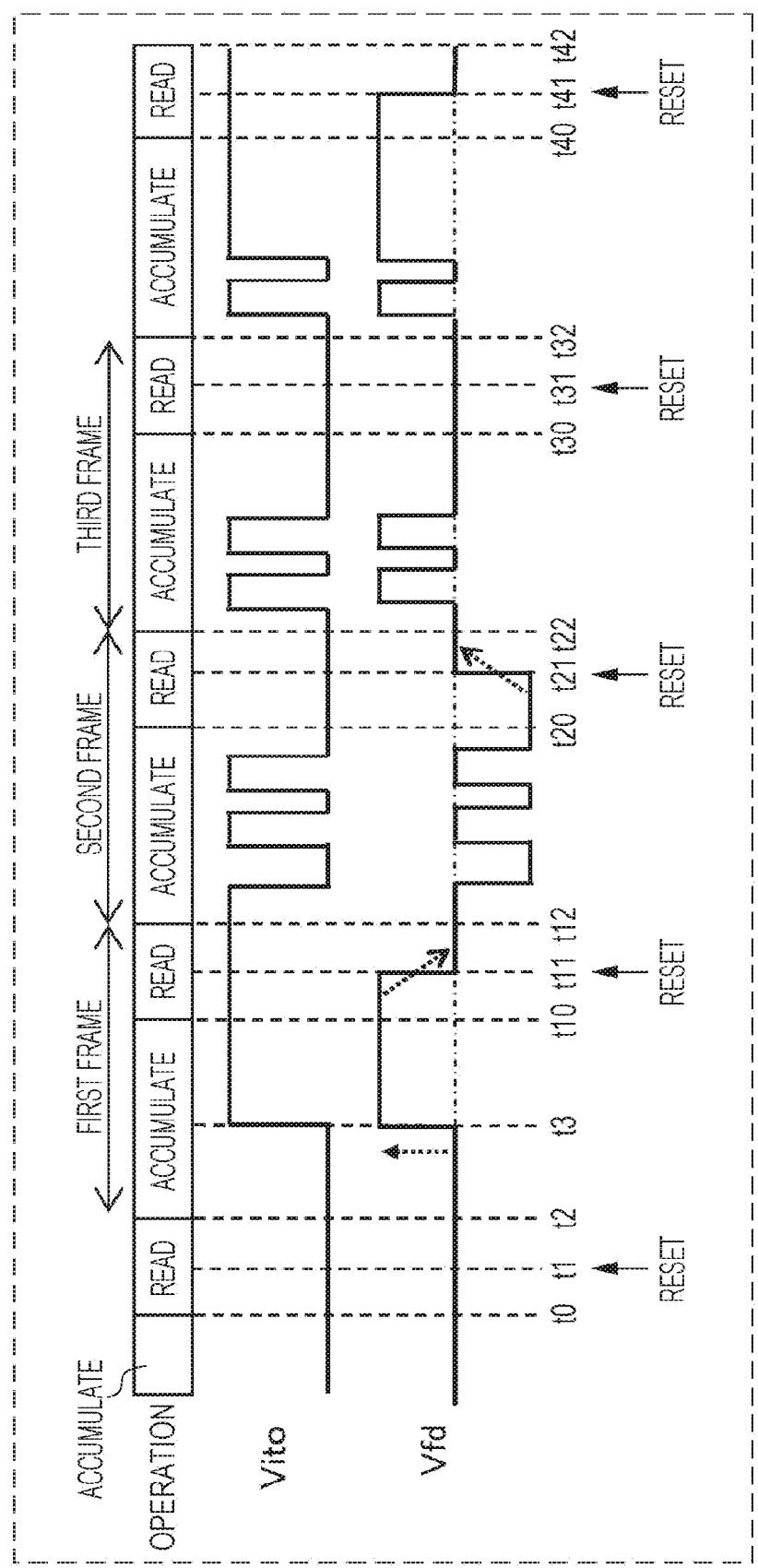
FIG. 6 is a time chart illustrating an operation example of an imaging device according to a comparative example.

FIG. 6 is a time chart illustrating an operation example of an imaging device according to a comparative example. The example illustrated in FIG. 6 is intended for a pixel cell 10 that does not have a configuration for controlling the potential Vfd at the charge accumulation node FD. FIG. 6 illustrates an operation for four frames. The voltage Vito represents a voltage at the opposing electrode. The potential Vfd represents a potential at the charge accumulation node FD during dark time, that is, in the absence of incident light, for ease of understanding.

FIG. 9A is a view schematically illustrating captured images according to the comparative example. FIG. 9A illustrates a case in which the voltage Vito at the opposing electrode when pixel signals are read is a high voltage in a first frame, is a low voltage in a second frame, and is a low voltage in a third frame, as illustrated in FIG. 6. Of images P1 to P3, the image P2 is generally dark compared with the images P1 and P3. That is, the image quality of the image P2 deteriorates. A cause for the deterioration will be described with reference to FIG. 6.

In FIG. 6, the voltage Vito at the opposing electrode is a high voltage in the reading period of the first frame and is a low voltage in the reading period of the subsequent second frame. In this case, pixel signals in the second frame are read when the voltage Vito at the opposing electrode is a low voltage.

However, the pixel signals in the second frame correspond to the amount of signal charge accumulated after being reset when the voltage Vito at the opposing electrode is a high voltage in the first frame. Hence, when pixel signals are read when the voltage Vito at the opposing electrode is a high voltage, the values of true pixel signals are obtained. However, pixel signals that are read when the voltage Vito at the opposing electrode is a low voltage have smaller values than the values of true pixel signals.

Thus, when the voltage Vito at the opposing electrode in a reading period is changed from a high voltage to a low voltage between frames, a phenomenon in which an image becomes dark in the frame immediately after the change occurs.

In the third frame, which follows the second frame, such a phenomenon does not occur when the voltage Vito at the opposing electrode is kept at the low voltage. This is because the voltage Vito at the opposing electrode during immediately previous resetting and the voltage Vito at the opposing electrode during the image-signal reading are the same.

As described above, when the voltage Vito at the opposing electrode in a reading period is changed from a high voltage to a low voltage between frames, the phenomenon in which an image becomes dark in only the frame immediately after the change occurs, as in FIG. 9A.

Conversely, when the voltage Vito at the opposing electrode changes from the low voltage to the high voltage between frames, a phenomenon in which an image becomes bright in only the frame immediately after the change occurs.

Figure 5B:
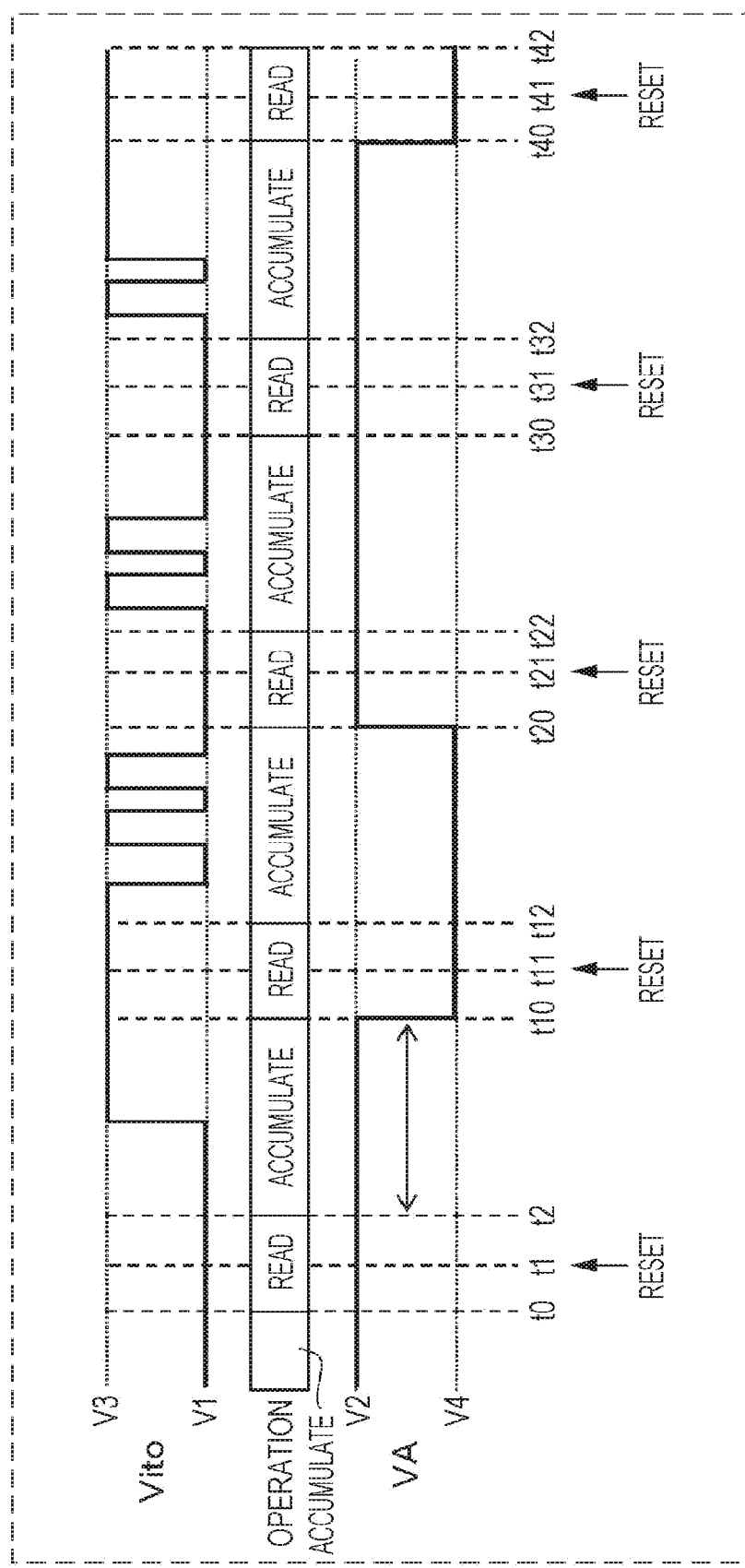
FIG. 5B is a time chart illustrating an operation example of the imaging device according to the first embodiment.

Next, a description will be given of an operation example according to the first embodiment. FIG. 5B is a time chart illustrating an operation example of the imaging device according to the first embodiment. In FIG. 5B, the horizontal axis represents a time axis. The vertical axis represents the voltage Vito for sensitivity control, an operation in the imaging device, and the voltage VA.

The voltage Vito indicates a waveform that changes between the voltage V3, which has a high level, and the voltage V1, which has a low level. The voltage VA indicates a waveform that changes between the voltage V2, which has a high level, and the voltage V4, which has a low level.

FIG. 5B illustrates an operation of the pixel cells 10 in one row which are included in the plurality of pixel cells 10 in the imaging device. The operation illustrated in FIG. 5B includes five reading periods, that is, is performed in five frames.

The reading periods include reading periods in which the voltage V3 is applied to the opposing electrode and reading periods in which the voltage V1 is applied to the opposing electrode.

A period from t0 to t1 in a reading period from t0 to t2 is a period in which pixel signals corresponding to the amount of signal charge accumulated in the charge accumulation nodes FD are read. At time t1, the reset transistor 2 resets the potential at the charge accumulation node FD to the reference potential. In a period from t1 to t2, the reset potential at the charge accumulation node FD, that is, a reference signal corresponding to the reference potential at the reset level, is read. The same applies to other reading periods, such as a reading period from t10 to t12.

In each accumulation period, the ratio of a high-level period in which the voltage Vito is set to the voltage V3 versus a low-level period in which the voltage Vito is set to the voltage V1 is adjusted to thereby adjust the sensitivity. For example, in an accumulation period from t2 to t10, the ratio of the first-half low-level period versus the last-half high-level period is about half and half, and the sensitivity is about 50%. In other accumulation periods, the sensitivity is also adjusted using the ratio of the low-level period versus the high-level period.

The voltage VA is controlled in the following manner. In each reading period, when the first voltage supply circuit 30 supplies the voltage V1, which has a low level, as the voltage Vito, the second voltage supply circuit 21 supplies the voltage V2, which has a high level, as the voltage VA. Also, in each reading period, when the first voltage supply circuit 30 supplies the voltage V3, which has a high level, as the voltage Vito, the second voltage supply circuit 21 supplies the voltage V4, which has a low level, as the voltage VA.

In other words, in each reading period, the voltage VA is controlled so as to have an opposite phase relationship with the voltage Vito. In each of the five reading periods in FIG. 5B, the opposite phase relationship is satisfied. This makes it possible to satisfy equation 3 noted above or to bring the electric characteristics close to the state in equation 3. Thus, it is possible to cancel or reduce potential variations at the charge accumulation node FD. Each reading period is one example of the above-described predetermined period, that is, a period in which the potential variations ΔVfd in equation 1 affect the image quality or pixel signals.

For example, when the voltage Vito is changed in the present reading period relative to the previous reading period in the previous frame, the second voltage supply circuit 21 also changes the level of the voltage VA in order to satisfy the opposite phase relationship in each reading period.

In each of the second, third, and fifth reading periods of the reading periods illustrated in FIG. 5B, since the voltage Vito is changed relative to that in the previous reading period, the voltage VA is also changed so as to have a phase opposite to the voltage Vito. In the fourth reading period, since the voltage Vito is the same as that in the previous reading period, the voltage VA maintains a phase opposite to the voltage Vito and is thus not changed.

Next, a description will be given of a timing at which the voltage VA is changed.

For example, in order for the voltage VA to satisfy the opposite phase relationship with the voltage Vito in each reading period, the voltage VA may be changed in a period from when the previous reading period is completed until the present reading period is started. This period is, for example, the accumulation period from t2 to t10.

More specifically, the voltage VA may be changed in a period from when the outputting of the reference signal in the previous reading period is completed until immediately before the start of outputting of the pixel signal in the present reading period. FIG. 5B illustrates an example in which the voltage VA is changed immediately before the reading period. This change can be performed for each row.

Also, the voltage Vito can be changed a plurality of times in each accumulation period. In contrast, the number of changes in the voltage VA may be one in each accumulation period.

It should be noted that the high level and the low level of each of the voltages Vito and VA mean a relative magnitude relationship and do not mean absolute values. That is, the high level of the voltage Vito may be a value different from the value of the high level of the voltage VA, and the low level of the voltage Vito may be a value different from the value of the low level of the voltage VA.

Next, for comparison with the first embodiment, an operation of the imaging device according to the comparative example will be described in more detail with reference back to FIG. 6.

As illustrated in FIG. 6, when the voltage Vito is changed from the low level to the high level at time t3, the potential Vfd increases due to coupling. Also, as in an accumulation period from t12 to t20 and in an accumulation period from t22 to t30, the potential Vfd increases when the voltage Vito increases, and decreases when the voltage Vito decreases.

In a reading period from t10 to t12, a pixel signal that exhibits higher value than the actual value is read when the voltage Vito is at the high level. The reason is as follows. The potential Vfd at the charge accumulation node FD reaches the reference potential at time t1 and then increases due to coupling that occurs upon an increase in the voltage Vito at the opposing electrode 13. The potential Vfd read between t10 and t11 increases by an amount corresponding to that increase. After the potential Vfd is reset at t11, the potential Vfd reaches the reference potential that is the same potential at time t1, regardless of the potential at the opposing electrode 13. Accordingly, since the difference between the potential Vfd read between t10 and t11 and the potential Vfd reset at t11 has a value corresponding to an increase in the potential Vfd at the charge accumulation node FD owing to the coupling, a brighter image than an actual image is acquired.

When the voltage Vito is at the low level at the reset timing at time t21, the potential Vfd indicating a signal level immediately before the resetting and the potential Vfd indicating the reference level immediately after the resetting have a large difference even in dark time. This difference occurs in all pixel cells in the same row. In this case, since the signal level takes a negative value smaller than the reference level, the signal level deviates from an analog-to-digital (A/D) conversion range, which can cause waveform deformation or deterioration of pixel signals.

Next, an operation of the imaging device according to the first embodiment will be described in comparison with FIG. 6.

Figure 7:
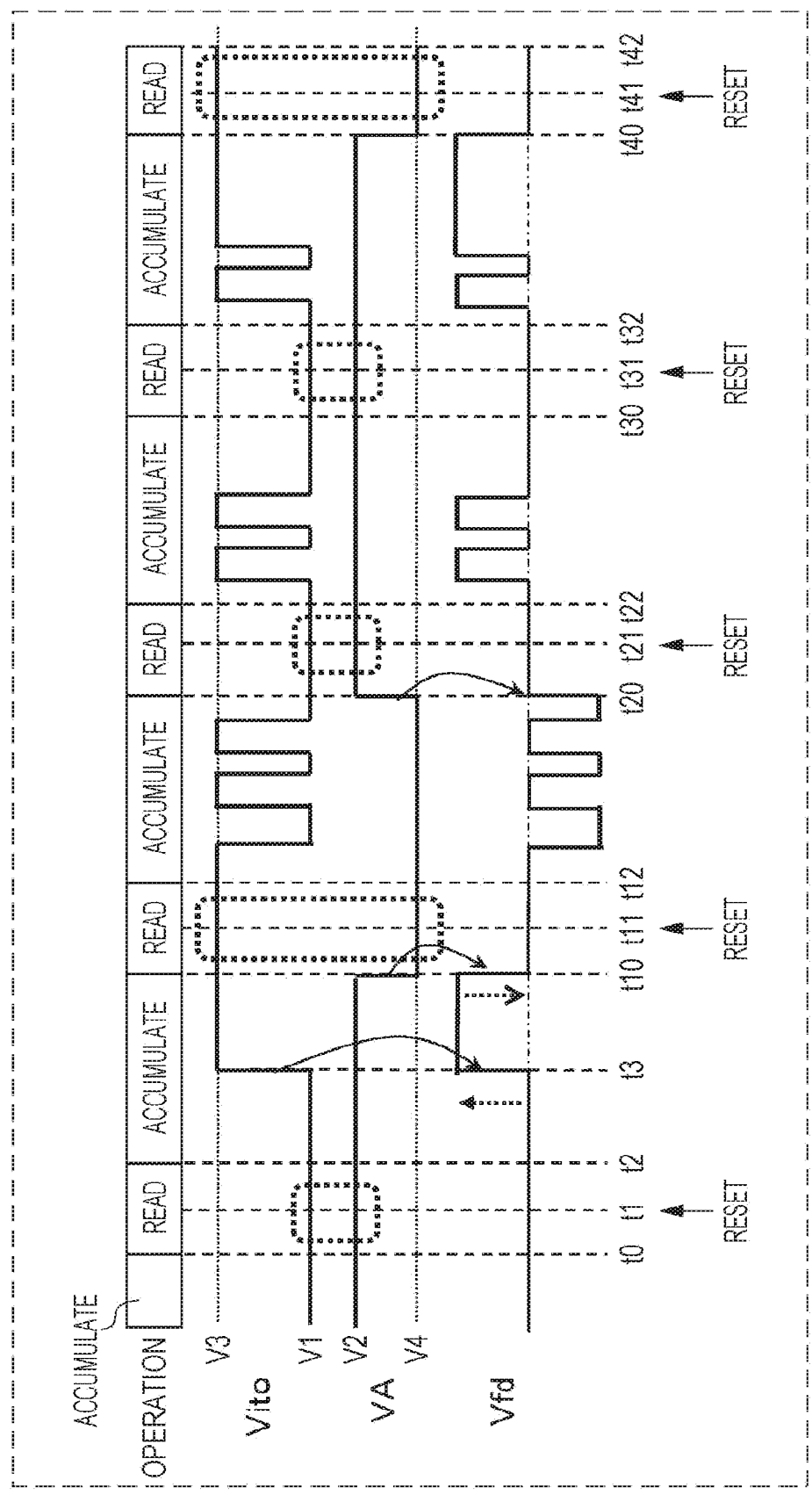
FIG. 7 is a time chart illustrating an operation example of the imaging device according to the first embodiment.

FIG. 7 is a time chart illustrating an operation example of the imaging device according to the first embodiment. The imaging device according to the first embodiment differs from that in FIG. 6 in that the voltage VA is incorporated, as described with reference to FIG. 5B. FIG. 7 also illustrates an operation example during dark time.

As indicated by dotted frames in FIG. 7, the voltage VA is controlled so as to have a phase opposite to the voltage Vito in each reading period. This cancels or reduces potential variations at the charge accumulation node FD which are caused by variations in the voltage Vito. As a result, the potential Vfd indicating a signal level immediately before resetting in each reading period and the potential Vfd indicating a reference level immediately after the resetting maintain an inherent state of dark time, that is, the same level.

Thus, in each reading period, the voltage VA is controlled so as to have an opposite phase relationship with the voltage Vito. In any of four reading periods in FIG. 7, the opposite phase relationship is satisfied. This makes it possible to satisfy equation 3 noted above or to bring the electric characteristics close to equation 3. Thus, it is possible to cancel or reduce potential variations at the charge accumulation node FD.

[1.6 Modification]

Next, a description will be given of a modification of the first embodiment. In this modification, a description will be given of an example in which the voltage Vito has multiple values larger than two values.

Figure 8:
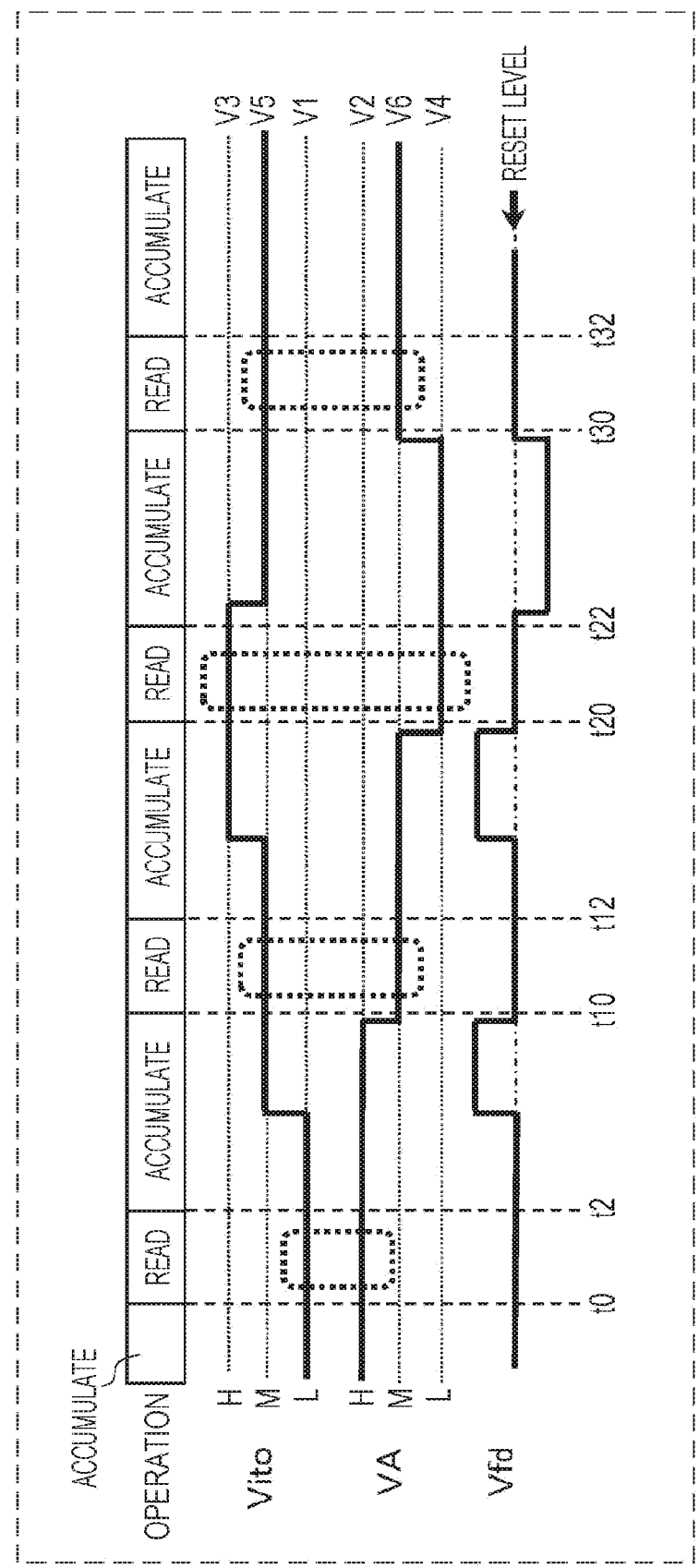
FIG. 8 is a time chart illustrating an operation example of an imaging device according to a modification of the first embodiment.

FIG. 8 is a time chart illustrating an operation example of the imaging device according to the modification of the first embodiment. FIG. 9 illustrates a case in which the voltage Vito can take three values: a high level, a middle level, and a low level. FIG. 8 illustrates an operation, the voltage Vito, the voltage VA, and the potential Vfd at the charge accumulation node FD. The operation example illustrated in FIG. 8 is also an operation during dark time.

In each reading period, similarly to Vito, the voltage VA can take three values, as denoted by dotted frames. When Vito is at the middle level, the voltage VA is controlled to the middle level. With respect to the high level and the low level of the voltage VA, it is controlled so as to have a phase opposite to the voltage Vito. This makes it possible to cancel or reduce potential variations at the charge accumulation node FD in any of the reading periods.

[1.7 Advantages]

Next, a description will be given of advantages offered by the imaging device in the first embodiment.

FIG. 9B is a diagram schematically illustrating images captured by the imaging device according to the first embodiment.

FIG. 9B illustrates a case in which the voltage Vito at the opposing electrode when pixel signals are read is at the high level in a first frame, is at the low level in a second frame, and is at the low level in a third frame. In this case, in each reading period, the voltage VA is at the low level in the first frame, is at the high level in the second frame, and is at the high level in the third frame.

Images P11 to P13 do not exhibit rapid brightness variations due to potential variations at the charge accumulation node FD, compared with the images in FIG. 9A. That is, image-quality deterioration due to variations in the voltage Vito at the opposing electrode is reduced significantly. Thus, the first embodiment offers an advantage of reducing the image-quality deterioration due to a potential change at the opposing electrode.

In the first embodiment, the voltage VA may be changed so as to satisfy the opposite phase relationship in synchronization with changes in the voltage Vito. The voltage VA may be changed for all the rows at the same time, not for each row.

Second Embodiment

In the present embodiment, an operation example for suppressing or reducing a sensitivity decrease and a saturation decrease in each accumulation period. Specifically, in each accumulation period, the second voltage supply circuit 21 supplies a voltage lower than that in each reading period to the capacitor CA.

[2.1 Configuration of Imaging Device]

The configuration of an imaging device according to a second embodiment is the substantially the same as the configuration in the first embodiment.

[2.2 Operation of Imaging Device]

Figure 10:
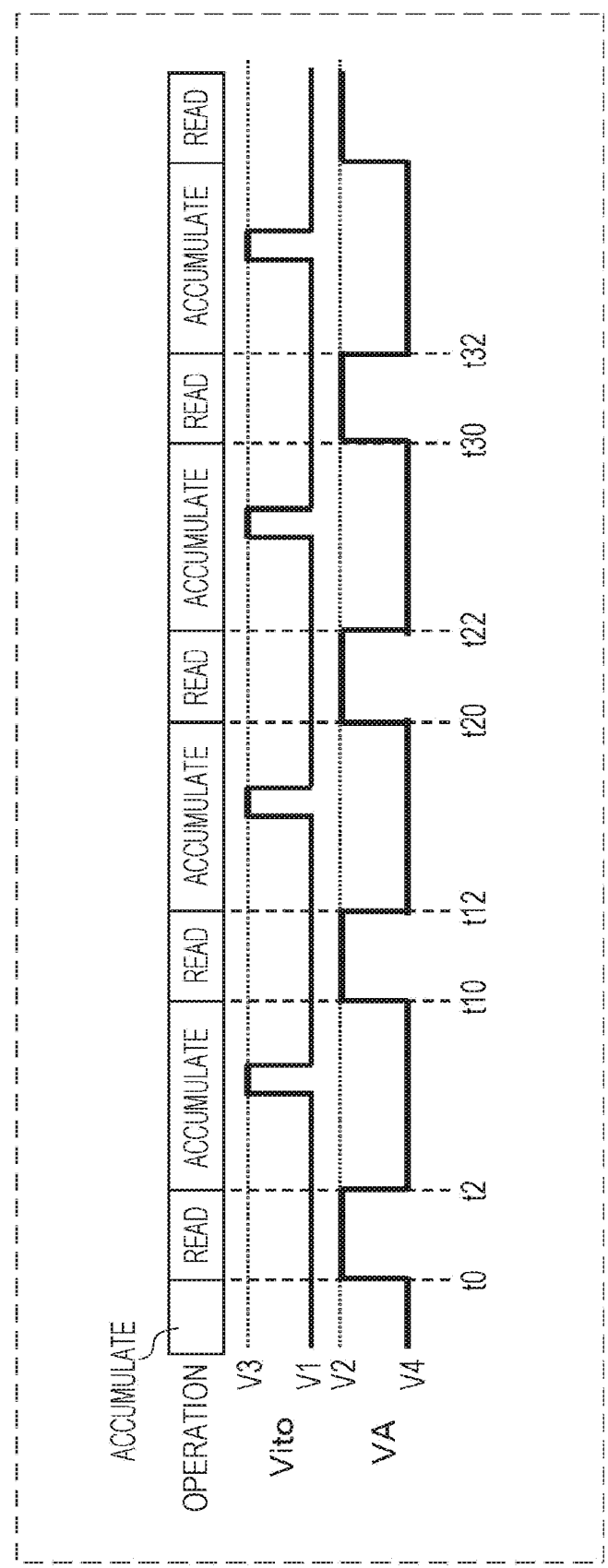
FIG. 10 is a time chart illustrating an operation example of an imaging device according to a second embodiment.

FIG. 10 is a time chart illustrating an operation example of the imaging device according to the second embodiment. FIG. 10 illustrates an operation in the pixel cells 10 in one row which are included in the plurality of pixel cells 10 in the imaging device or an operation in one pixel cell 10. The operation illustrated in FIG. 10 includes five reading periods, that is, is performed in five frames.

The first voltage supply circuit 30 supplies the voltage V1 so that the sensitivity is zero except in a certain period in each accumulation period and supplies the voltage V3, which is higher than the voltage V1, only in the certain period in each accumulation period.

The second voltage supply circuit 21 supplies the voltage V2 in each reading period and supplies the voltage V4, which is lower than the voltage V2, in each accumulation period.

This operation can suppress or reduce a sensitivity decrease and a saturation decrease. The reason will be described with reference to FIGS. 11 and 12.

Figure 11:
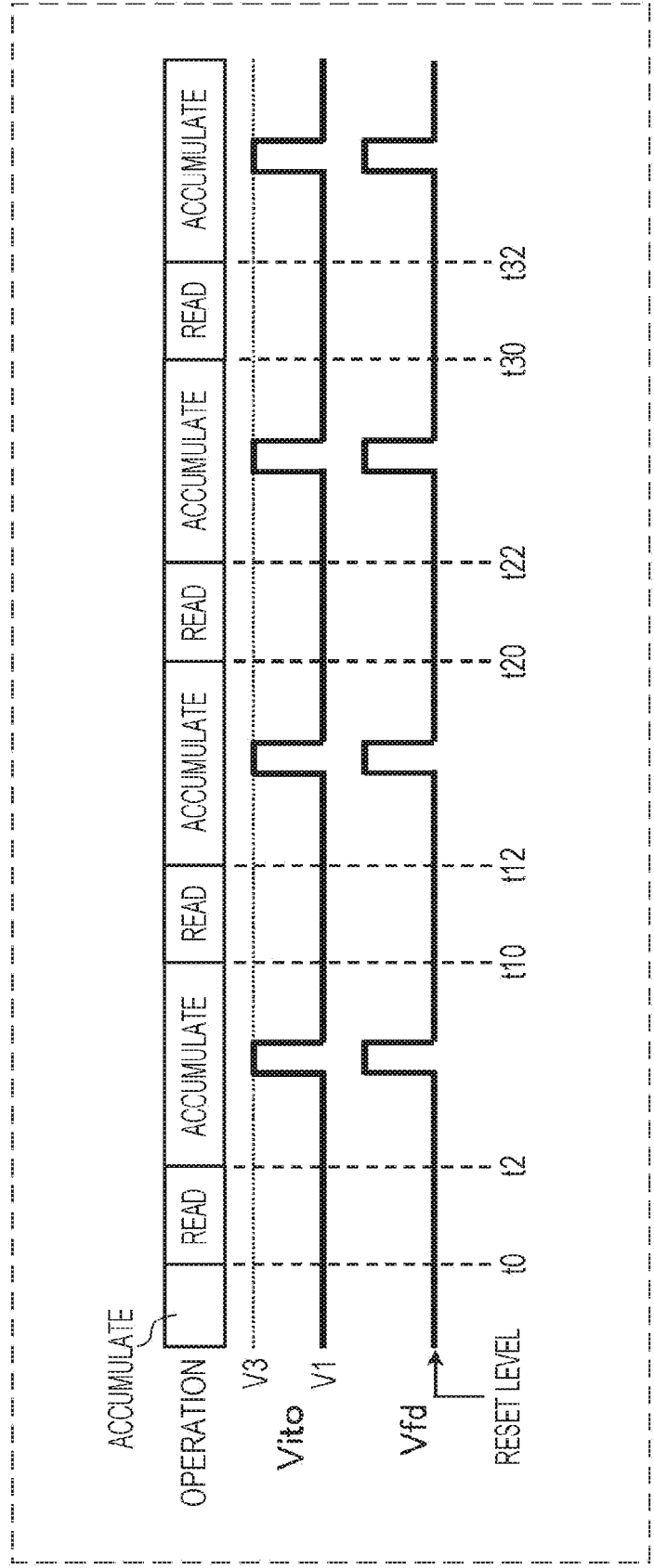
FIG. 11 is a time chart illustrating an operation example of an imaging device according to a comparative example.

FIG. 11 is a time chart illustrating an operation example of an imaging device according to a comparative example. FIG. 11 is intended for pixel cells 10 that do not have a configuration for controlling the potentials Vfd at the charge accumulation nodes FD. In order to accentuate variations due to the voltage Vito, the potential Vfd represents a potential at the charge accumulation node FD during dark time, that is, in the absence of incident light. Also, the state in which the voltage Vito is at the low level is, for example, a state in which the sensitivity is zero, and light is not photoelectrically converted. In this state, the electronic shutter is closed. The state in which the voltage Vito is at the high level is assumed to be a state in which light is photoelectrically converted.

The sensitivity of the photoelectric converter 11 depends on a potential difference applied to the photoelectric conversion layer 14, that is, depends on Vito-Vfd, and increases as the potential difference increases.

When the voltage Vito is set to the high level in one accumulation period, the potential Vfd also increases due to the coupling, as illustrated in FIG. 11. As a result, virtually, the potential difference applied to the photoelectric conversion layer 14 decreases, and the sensitivity decreases. Also, when the potential Vfd increases, there are cases in which the amount of saturated charge in the charge accumulation node FD decreases.

Figure 12:
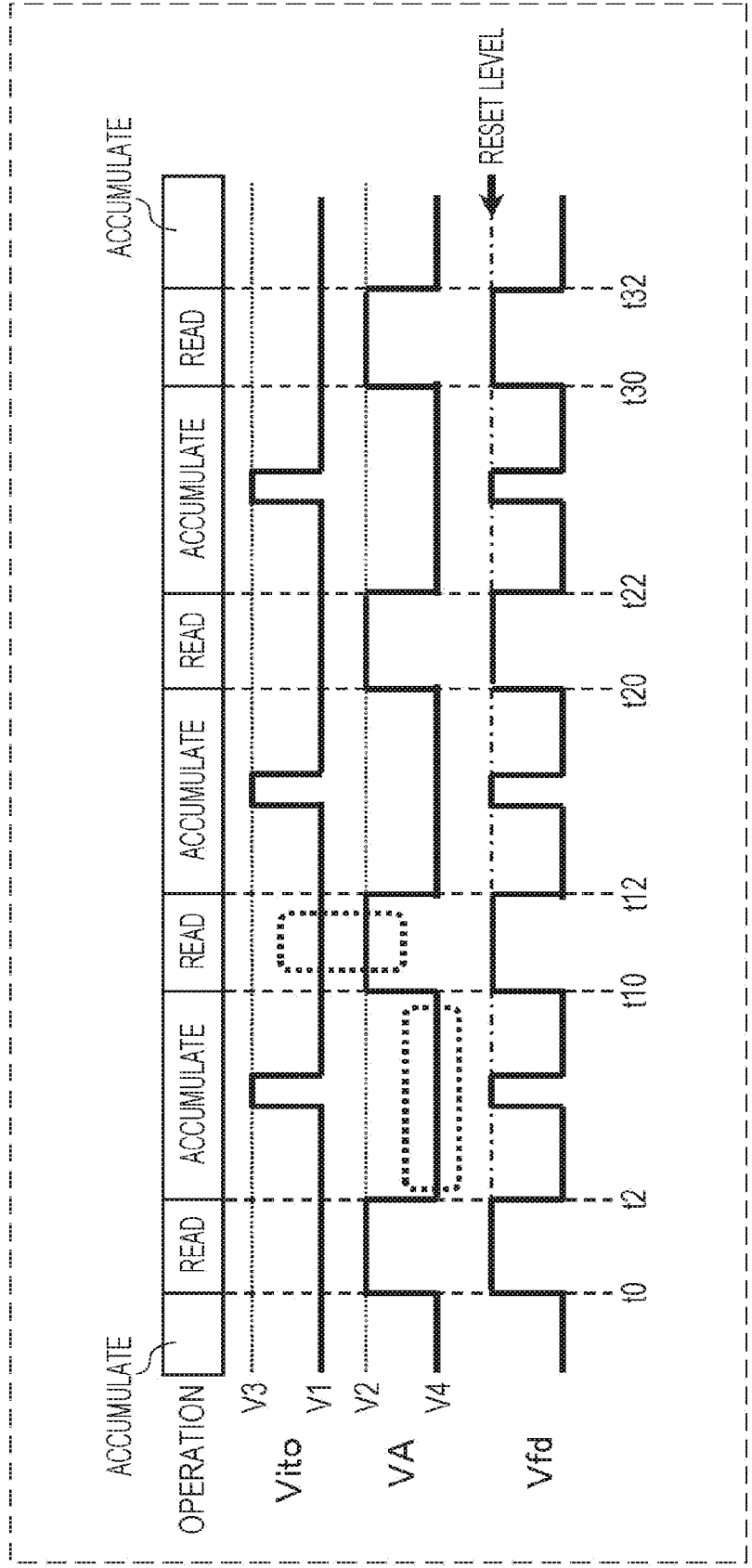
FIG. 12 is a time chart illustrating an operation example of the imaging device according to the second embodiment.

In order to overcome such a problem, operations as illustrated in FIGS. 10 and 12 are performed in the present embodiment.

FIG. 12 is a time chart illustrating an operation example of the imaging device according to the second embodiment. In FIG. 12, a prerequisite is also the same as that in FIG. 10, and the potential Vfd represents a potential during dark time.

As illustrated in FIG. 12, in each reading period, the voltage Vito at the opposing electrode 13 is the voltage V1, which has a low level. In each accumulation period, the voltage VA is set to the voltage V4, which has a low level, as denoted by a dotted frame. The voltage VA in each reading period is the voltage V2, which has a high level and has a phase that is opposite to the phase of the voltage Vito, as denoted by a dotted frame.

According to the present embodiment, in each accumulation period, a potential difference applied to the photoelectric conversion layer 14, that is, Vito-Vfd, can be increased compared with FIG. 11. This makes it possible to suppress or reduce a sensitivity decrease in the photoelectric converter 11. Also, it is possible to suppress or reduce a decrease in the amount of saturated charge.

Third Embodiment

In a third embodiment, a description will be given of an operation example for reducing leakage of signal charge in each accumulation period. Specifically, in each accumulation period, the second voltage supply circuit 21 supplies a voltage higher than a voltage in each reading period to the capacitor CA.

[3.1 Configuration of Imaging Device]

The configuration of an imaging device according to the third embodiment is the same as the configuration in the first embodiment.

[3.2 Operation of Imaging Device]

Figure 13:
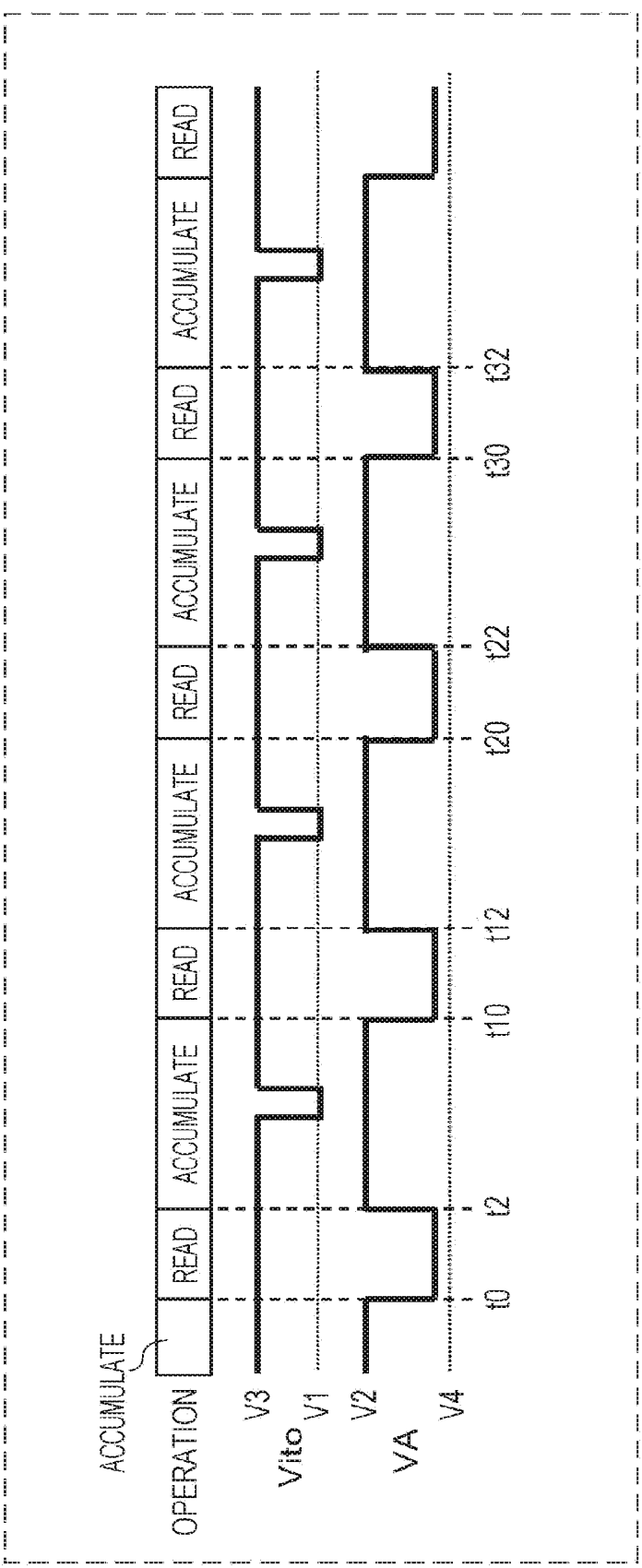
FIG. 13 is a time chart illustrating an operation example of an imaging device according to a third embodiment.

FIG. 13 is a time chart illustrating an operation example of the imaging device according to the third embodiment. FIG. 13 illustrates an operation in the pixel cells 10 in one row which are included in the plurality of pixel cells 10 in the imaging device or an operation in one pixel cell 10. The operation illustrated in FIG. 13 includes five reading periods, that is, is performed in five frames.

The first voltage supply circuit 30 supplies the voltage V3 except in a certain period in each accumulation period and supplies the voltage V1, which is lower than the voltage V3, in only the certain period in each accumulation period. The second voltage supply circuit 21 supplies the voltage V4 in each reading period and supplies the voltage V2, which is higher than the voltage V4, in each accumulation period.

According to the present embodiment, even when the voltage Vito varies to the low level temporarily in each accumulation period, leakage of signal charge can be suppressed or reduced. The reason will be described with reference to FIGS. 14 and 15.

Figure 14:
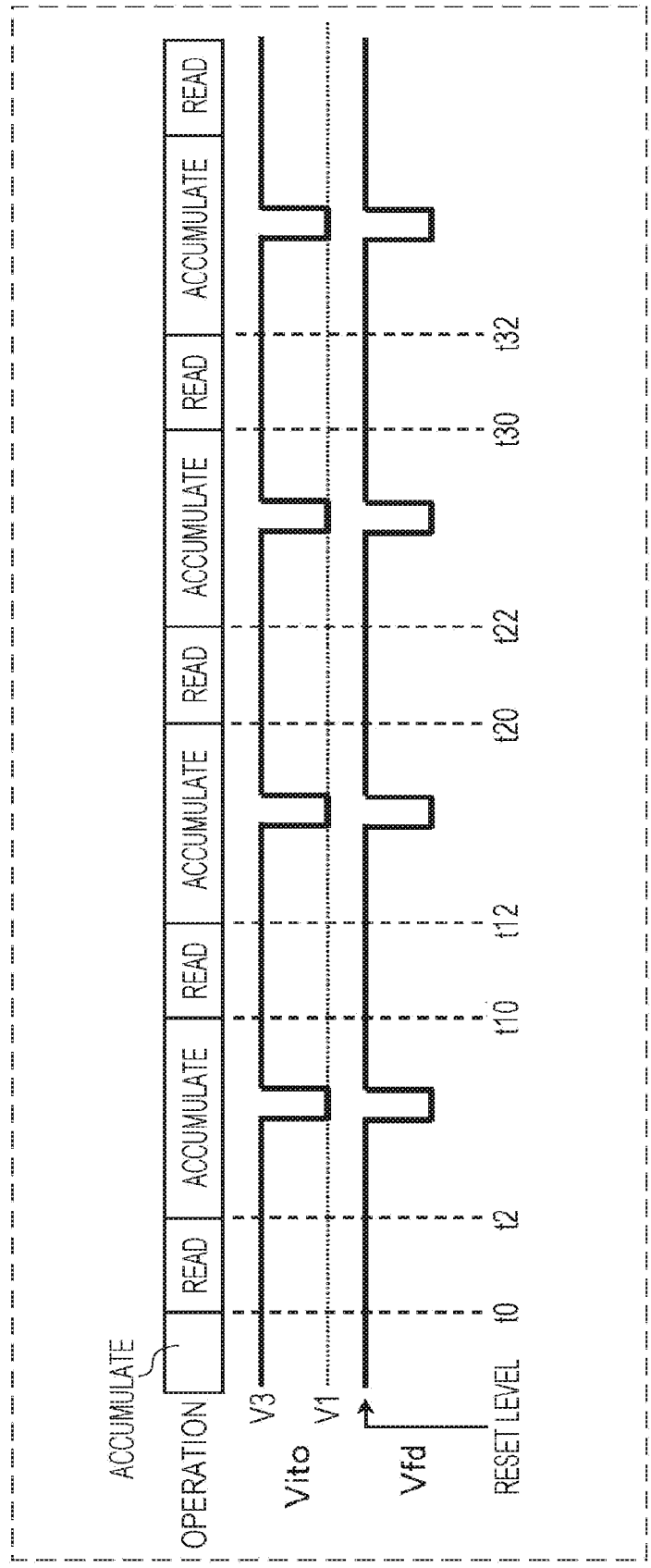
FIG. 14 is a time chart illustrating an operation example of an imaging device according to a comparative example.

FIG. 14 is a time chart illustrating an operation example of the imaging device according to the comparative example. FIG. 14 is intended for pixel cells 10 that do not have a configuration for controlling the potentials Vfd at the charge accumulation nodes FD. In order to accentuate variations due to the voltage Vito, the potential Vfd represents a potential at the charge accumulation node FD during dark time, that is, in the absence of incident light. Also, the state in which the voltage Vito is at the low level is, for example, a state in which the sensitivity is zero, and light is not photoelectrically converted that is, a state in which the electronic shutter is closed. The state in which the voltage Vito is at the high level is assumed to be a state in which light is photoelectrically converted.

In each exposure period, when the voltage Vito at the opposing electrode reaches the low level temporarily, the potential Vfd at the charge accumulation node FD also decreases due to the coupling. In this case, as illustrated in FIG. 14, the potential Vfd may become lower than the reset level, which is a reference potential. When the reset level is low, a parasitic PN diode between the diffusion layer formed in the semiconductor substrate as a part of the charge accumulation node FD and the semiconductor substrate can shift from a reverse bias state to a forward bias state. This can cause leakage of signal charge accumulated in the diffusion layer. As a result, there is a possibility that the waveform of low-level pixel signals is deformed.

Figure 15:
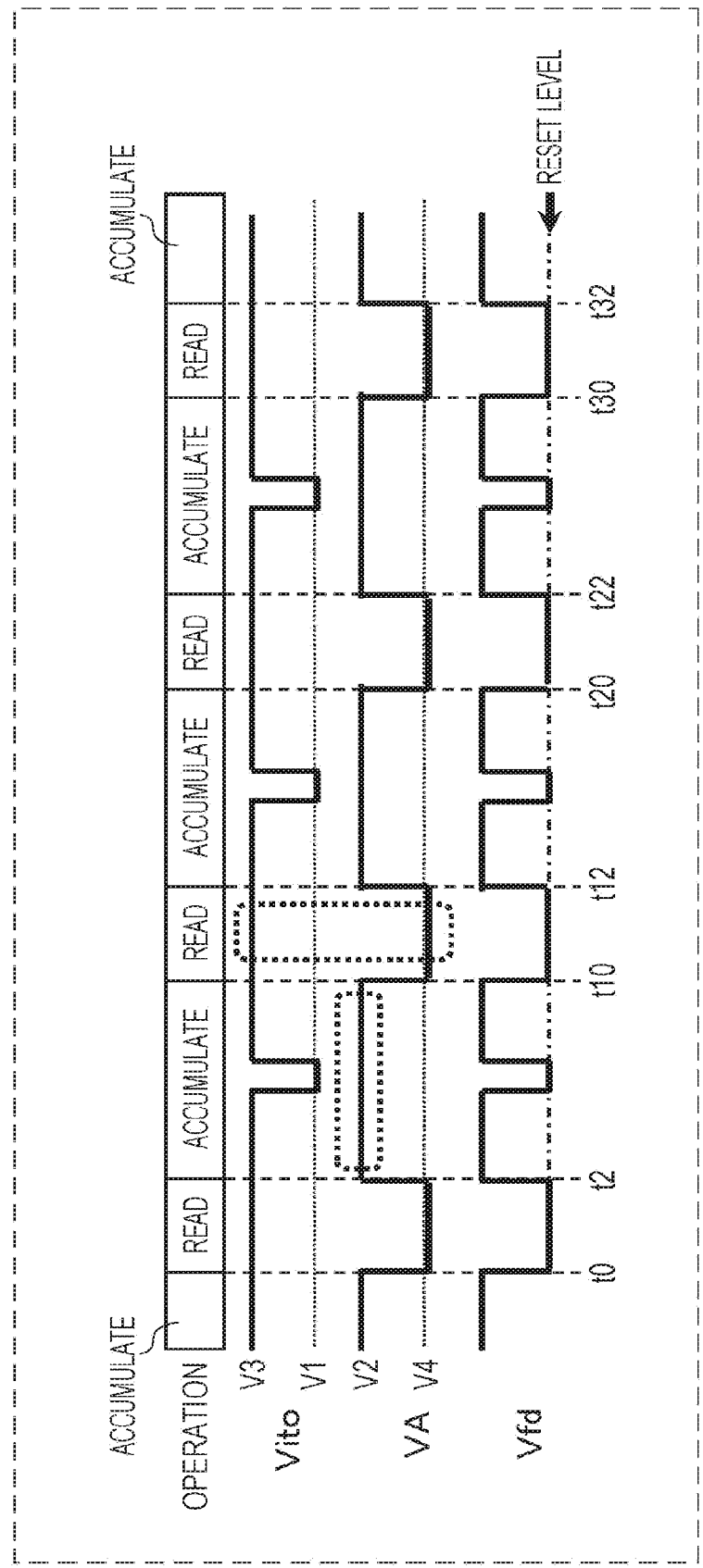
FIG. 15 is a time chart illustrating an operation example of the imaging device according to the third embodiment.

In order to overcome such a problem, operations as illustrated in FIGS. 13 and 15 are performed in the present embodiment.

FIG. 15 is a time chart illustrating an operation example of the imaging device according to the third embodiment. In FIG. 15, a prerequisite is also the same as that in FIG. 13, and the potential Vfd represents a potential during dark time.

As illustrated in FIG. 15, in each reading period, the voltage Vito at the opposing electrode 13 is the voltage V3, which has a high level. Also, as denoted by a dotted frame, the voltage VA in each accumulation period is set to the voltage V2, which has a high level. The voltage VA in each reading period is the low-level voltage V4, which has a low level and has a phase that is opposite to the voltage Vito, as denoted by a dotted frame.

According to the present embodiment, the possibility that the potential Vfd at the charge accumulation node FD becomes lower than the reset level, which is a reference potential, can be reduced in each accumulation period. This makes it possible to suppress or reduce deformation of the waveform of pixel signals. In addition, it is also possible to set the reset level to a lower level.

Fourth Embodiment

In a fourth present embodiment, a description will be given of an example of the timing of changing the voltage Vito at the opposing electrode. Specifically, the first voltage supply circuit 30 in the fourth embodiment changes the voltage Vito in an ineffective-pixel reading period in one frame period. In other words, the first voltage supply circuit 30 does not change the voltage Vito in an effective-pixel reading period in one frame period.

[4.1 Configuration of Imaging Device]

Figure 16:
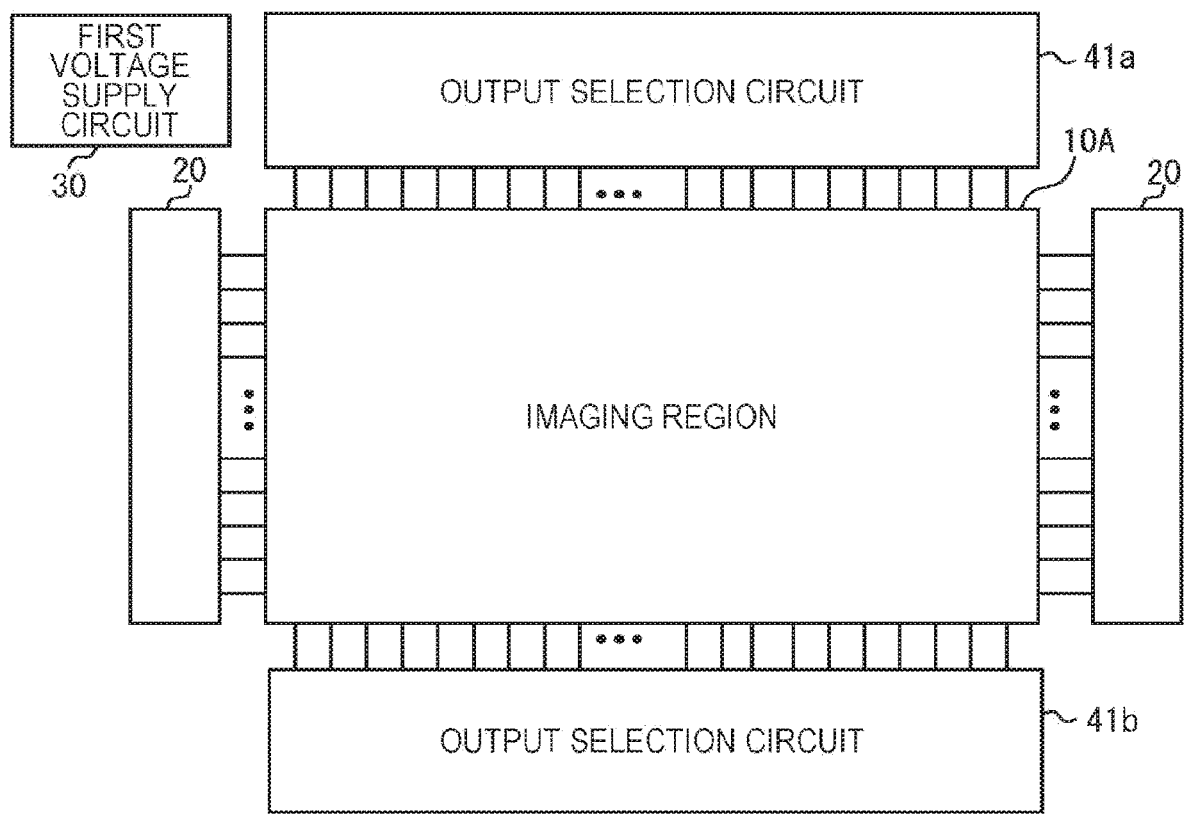
FIG. 16 is a block diagram illustrating a configuration example of an imaging device according to a fourth embodiment.

The imaging device according to the fourth embodiment may be the same as that of the first to third embodiments or may have a configuration as illustrated in FIG. 16. FIG. 16 is a block diagram illustrating a configuration example of the imaging device according to the fourth embodiment. Compared with FIG. 1, FIG. 16 differs in that the imaging device includes two vertical scanning circuits 20, not one vertical scanning circuit, and includes output selection circuits 41a and 41b, instead of the output selection circuit 41. The differences will be mainly described below.

The two vertical scanning circuits 20 each have substantially the same configuration as the vertical scanning circuit 20 illustrated in FIG. 1A and supply various control signals for each row from both left and right sides of an imaging region 10A. This makes it possible to reduce a time difference due to delays that occur at the left end and the right end of the imaging region 10A and enables higher-speed driving.

The output selection circuits 41a and 41b are circuits obtained by dividing the output selection circuit 41 in FIG. 1A into two circuits. For example, the output selection circuit 41a corresponds to odd-numbered columns of all columns of the pixel cells 10, and the output selection circuit 41b corresponds to even-numbered columns of all the columns of the pixel cells 10. This makes it possible to increase an output operation of pixel signals by a factor of two or more.

The output selection circuits 41a and 41b may share operation assignments other than for the odd-numbered columns and the even-numbered columns.

Next, a description will be given of a configuration example of the imaging region 10A.

Figure 17A:
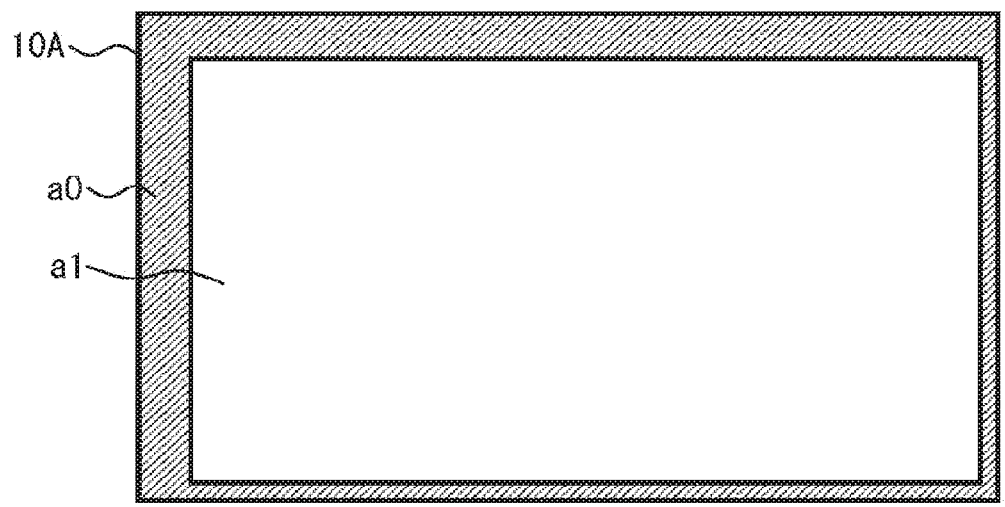
FIG. 17A is a block diagram illustrating an arrangement example of an effective-pixel region and an ineffective-pixel region according to the fourth embodiment.

FIG. 17A is a block diagram illustrating an arrangement example of an effective-pixel region and an ineffective-pixel region according to the fourth embodiment. In FIG. 17A, the imaging region 10A includes an ineffective-pixel region a0 and an effective-pixel region a1.

The ineffective-pixel region a0 is a region where ineffective pixels are arrayed. The ineffective pixels are formed as, for example, pixel cells 10 where incident light is blocked by a light-blocking film and output optical black levels as pixel signals. Ineffective pixels and effective pixels may be mixed in the ineffective-pixel region a0.

The effective-pixel region a1 is a region where effective pixels are arrayed. The effective pixels correspond to the pixel cells 10 illustrated in FIG. 1A and output pixel signals in accordance with the amounts of incident light. No ineffective pixels are provided in the effective-pixel region a1. In FIG. 17A, the ineffective-pixel region a0 is arranged along four sides of the imaging region 10A so as to surround the entire periphery of the effective-pixel region a1.

Figure 17B:
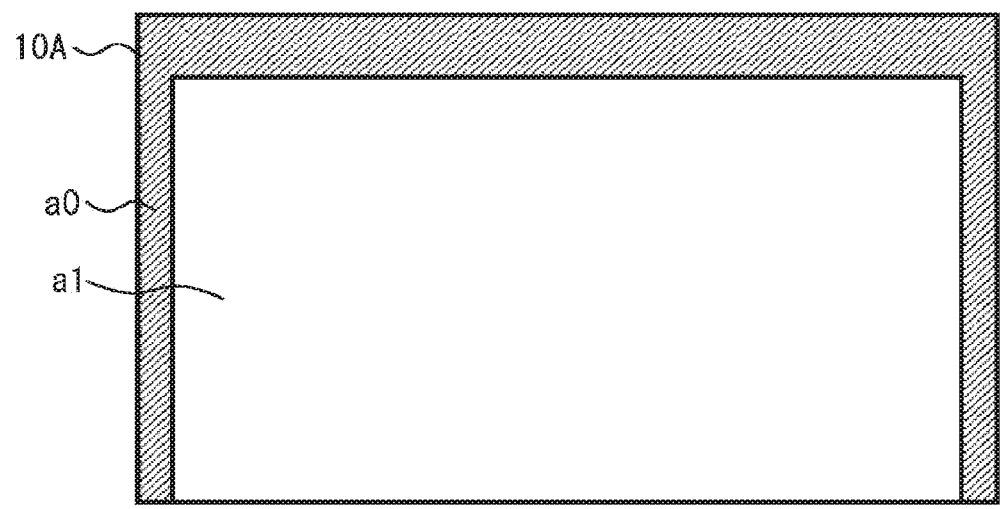
FIG. 17B is a block diagram illustrating another arrangement example of the effective-pixel region and the ineffective-pixel region according to the fourth embodiment.

FIG. 17B is a block diagram illustrating another arrangement example of the effective-pixel region and the ineffective-pixel region according to the fourth embodiment. In FIG. 17B, the ineffective-pixel region a0 is arranged outside three sides of the effective-pixel region a1 and along three sides of the imaging region 10A.

[4.2 Operation of Imaging Device]

Next, a description will be given of an operation of the imaging device according to the present embodiment.

Figure 18A:
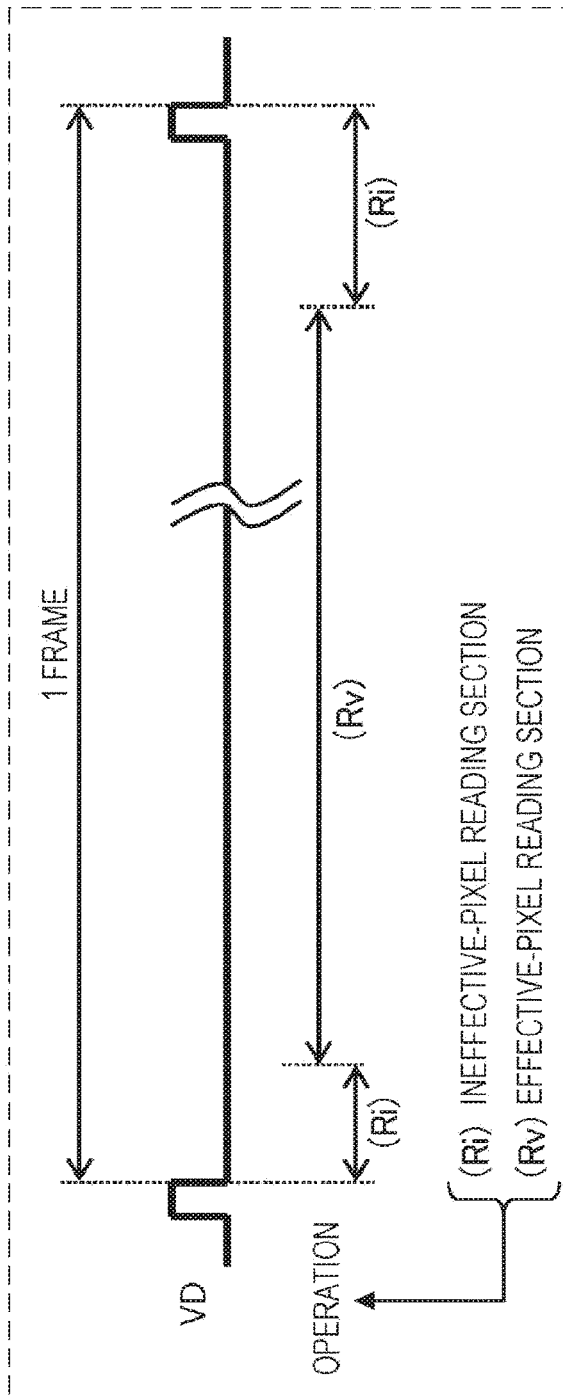
FIG. 18A is a diagram illustrating a reading operation example of the effective-pixel region and the ineffective-pixel region according to the fourth embodiment.

FIG. 18A is a diagram illustrating a reading operation example of the effective-pixel region and the ineffective-pixel region according to the fourth embodiment. FIG. 18A schematically illustrates ineffective-pixel reading periods (Ri) and an effective-pixel reading period (Rv) in one frame period.

In FIG. 18A, the ineffective-pixel reading periods (Ri) exist at a front end and a rear end of one frame period, and one effective-pixel reading period (Rv) exists between the reading periods (Ri).

Figure 18B:
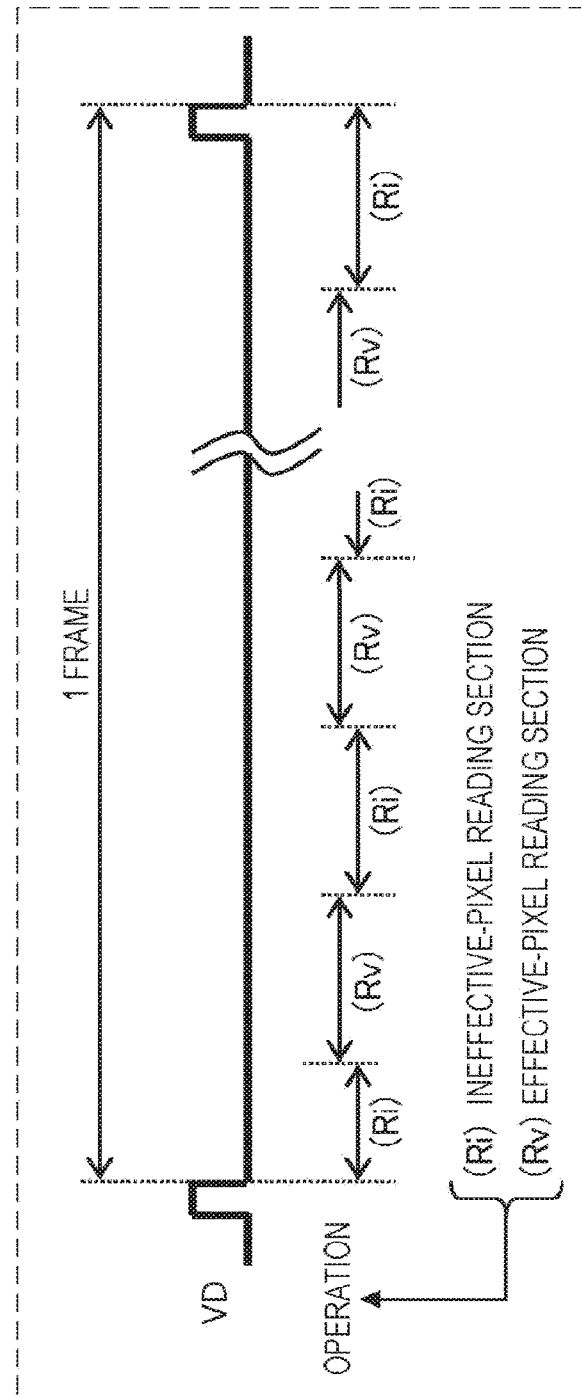
FIG. 18B is a diagram illustrating a reading operation example of the effective-pixel region and the ineffective-pixel region according to the fourth embodiment.

FIG. 18B is a diagram illustrating another reading operation example of the effective-pixel region and the ineffective-pixel region according to the fourth embodiment. In FIG. 18B, an ineffective-pixel reading period (Ri) and an effective-pixel reading period (Rv) are repeated a plurality of times in one frame period. In this case, for example, upon reading some of the effective pixels, the imaging device suspends the reading, jumps to the ineffective pixels temporarily, and then resumes accessing the effective pixel from the position where the reading was suspended.

Next, a description will be given of an example of the timing of changing the voltage Vito at the opposing electrode.

FIG. 19 is a diagram illustrating an example of the timing of changing the voltage Vito at the opposing electrode according to the fourth embodiment. The first voltage supply circuit 30 changes the voltage Vito in each ineffective-pixel reading period (Ri) in one frame period, as denoted by dotted frames. Also, the first voltage supply circuit 30 does not change the voltage Vito in each effective-pixel reading period (Rv) in one frame period.

This makes it possible to suppress or reduce pixel signal variations that occur due to voltage variations at the opposing electrode 13.

Although the imaging device according to one or more aspects of the present disclosure has been described above in conjunction with the embodiments, the present disclosure is not limited to the particular embodiments. A mode obtained by making various variations conceived by those skilled in the art to the embodiments and a mode constructed by combining some of the constituent elements in different embodiments may also be encompassed by the scope of the one of more aspects, as long as such modes do not depart from the spirit of the present disclosure.

What is claimed is:

1. An imaging device comprising:
   a photoelectric converter that includes a first electrode, a second electrode, and a photoelectric conversion layer between the first electrode and the second electrode and that generates a signal charge;
   a charge accumulator that is connected to the first electrode to accumulate the signal charge;
   a first voltage supply circuit that is connected to the second electrode and that selectively supplies at least two different voltages including a first voltage and a third voltage greater than the first voltage; and
   a second voltage supply circuit that is connected to the charge accumulator via capacitance and that selectively supplies at least two different voltages including a second voltage and a fourth voltage less than the second voltage, wherein
   in a first period in which the first voltage supply circuit supplies the first voltage, the first period being included in an accumulation period for accumulating the signal charge in the charge accumulator, the second voltage supply circuit supplies the second voltage.

2. The imaging device according to claim 1, further comprising:
   a capacitor that is connected between the second voltage supply circuit and the charge accumulator and that functions as the capacitance.

3. The imaging device according to claim 1, wherein the signal charge is a hole.

4. The imaging device according to claim 1, wherein the photoelectric converter has no sensitivity in the first period.

5. The imaging device according to claim 1, wherein the second voltage supply circuit supplies the second voltage in the accumulation period.

6. The imaging device according to claim 1, wherein the second voltage supply circuit supplies the fourth voltage in a reset period for resetting a voltage of the charge accumulator.

7. The imaging device according to claim 1, wherein the first voltage supply circuit supplies the third voltage in a second period that is different from the first period and that is included in the accumulation period.

8. An imaging device comprising:
   a photoelectric converter that includes a first electrode, a second electrode, and a photoelectric conversion layer between the first electrode and the second electrode and that generates a signal charge;
   a charge accumulator that is connected to the first electrode to accumulate the signal charge;
   a first voltage supply circuit that is connected to the second electrode and that selectively supplies at least two different voltages including a first voltage and a third voltage less than the first voltage; and
   a second voltage supply circuit that is connected to the charge accumulator via capacitance and that selectively supplies at least two different voltages including a second voltage and a fourth voltage greater than the second voltage, wherein
   in a first period in which the first voltage supply circuit supplies the first voltage, the first period being included in an accumulation period for accumulating the signal charge in the charge accumulator, the second voltage supply circuit supplies the second voltage.

9. The imaging device according to claim 8, further comprising:
   a capacitor that is connected between the second voltage supply circuit and the charge accumulator and that functions as the capacitance.

10. The imaging device according to claim 8, wherein the signal charge is an electron.

11. The imaging device according to claim 8, wherein the photoelectric converter has no sensitivity in the first period.

12. The imaging device according to claim 8, wherein the second voltage supply circuit supplies the second voltage in the accumulation period.

13. The imaging device according to claim 8, wherein the second voltage supply circuit supplies the fourth voltage in a reset period for resetting a voltage of the charge accumulator.

14. The imaging device according to claim 8, wherein the first voltage supply circuit supplies the third voltage in a second period that is different from the first period and that is included in the accumulation period.

* * * * *